(12) United States Patent  (10) Patent No.: US 8,025,732 B2
Sakurai et al.  (45) Date of Patent: Sep. 27, 2011

(54) APPARATUS FOR PROCESSING A SUBSTRATE

(75) Inventors: Hideaki Sakurai, Yokohama (JP); Masamitsu Itoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 179 days.

(21) Appl. No.: 12/071,235

(22) Filed: Feb. 19, 2008

(65) Prior Publication Data

US 2008/0173400 A1    Jul. 24, 2008

Related U.S. Application Data

(62) Division of application No. 11/103,472, filed on Apr. 12, 2005, now Pat. No. 7,354,869.

(30) Foreign Application Priority Data

Apr. 13, 2004  (JP) ................................. 2004-118279
Jun. 28, 2004  (JP) ................................. 2004-189928

(51) Int. Cl.
  *H01L 21/027* (2006.01)
  *G03F 7/30* (2006.01)
(52) U.S. Cl. .................................. 118/725; 156/345.12
(58) Field of Classification Search .............. 156/345.15, 156/345; 118/725
  See application file for complete search history.

(56) References Cited

U.S. PATENT DOCUMENTS

| 6,425,497 | B1* | 7/2002 | Chu et al. .......................... 222/64 |
| 6,550,990 | B2 | 4/2003 | Sakurai et al. |
| 6,929,903 | B2 | 8/2005 | Itoh et al. |
| 2004/0106072 | A1 | 6/2004 | Itoh et al. |
| 2008/0173400 | A1* | 7/2008 | Sakurai et al. ............. 156/345.15 |

FOREIGN PATENT DOCUMENTS

| JP | 10-092784 | 4/1998 |
| JP | 2000-228385 | 8/2000 |
| JP | 2000-306809 | 11/2000 |
| JP | 2002-252167 A2 | 9/2002 |
| JP | 2002-343711 | 11/2002 |

OTHER PUBLICATIONS

Machine Translation of JP 10-092784. Published Apr. 10, 1998.*
Machine Translation of JP 2002-343711. Published Nov. 29, 2002.*
"Notification of Reasons for Rejection" mailed Dec. 2, 2008, issued by the Japanese Patent Office in copending U.S. Appl. No. 2004-118279.
Notice of Reasons for Rejection mailed by the Japanese Patent Office on Nov. 18, 2008, for Japanese Patent Application 2004-189928.

* cited by examiner

*Primary Examiner* — Sylvia R. MacArthur
(74) *Attorney, Agent, or Firm* — Finnegan, Henderson, Farabow, Garrett & Dunner, L.L.P.

(57) ABSTRACT

A method for a substrate processing apparatus having a substrate holding mechanism and a chemical solution dispensing/sucking mechanism including a chemical solution dispensing port for supplying a first chemical solution and a chemical solution suction port, includes placing the target substrate on the substrate holding mechanism, laying out an auxiliary plate at a periphery of the substrate such that the two main faces are substantially flush with each other, supplying a second chemical solution onto the main faces, dispensing the first solution from the dispensing port and sucking the first and second solutions through the suction port, with the dispensing and suction ports brought into contact with the second solution, and while dispensing the first solution from the dispensing port and sucking the first solution through the suction port, scanning the dispensing/sucking mechanism such that the dispensing and suction ports are opposed to the main face of the substrate.

7 Claims, 14 Drawing Sheets

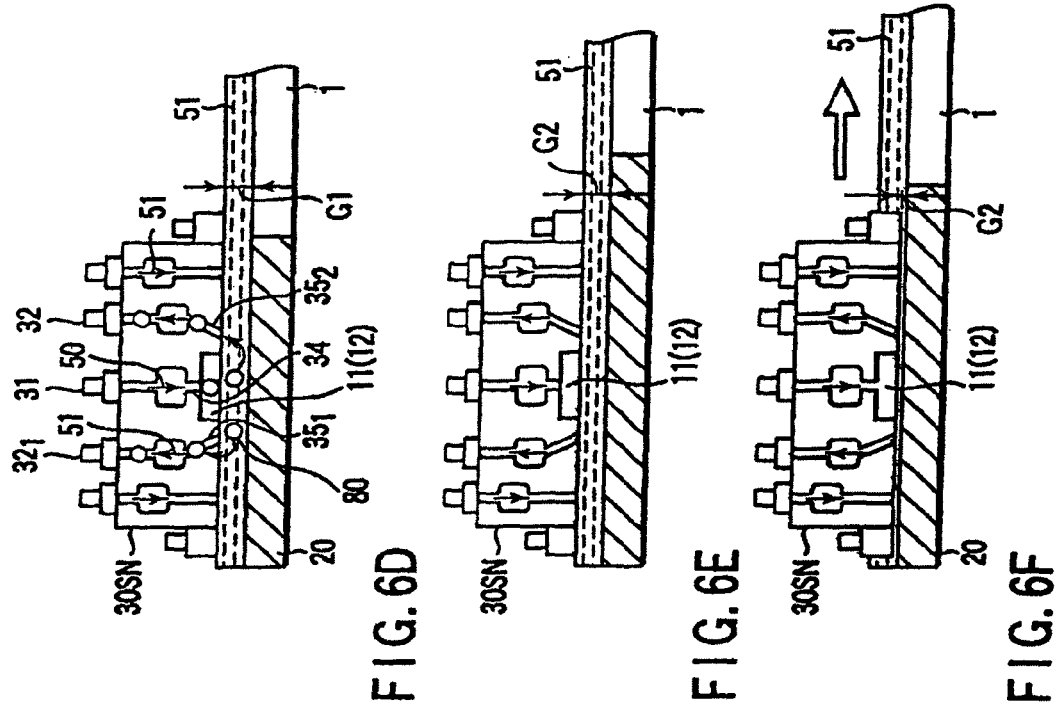
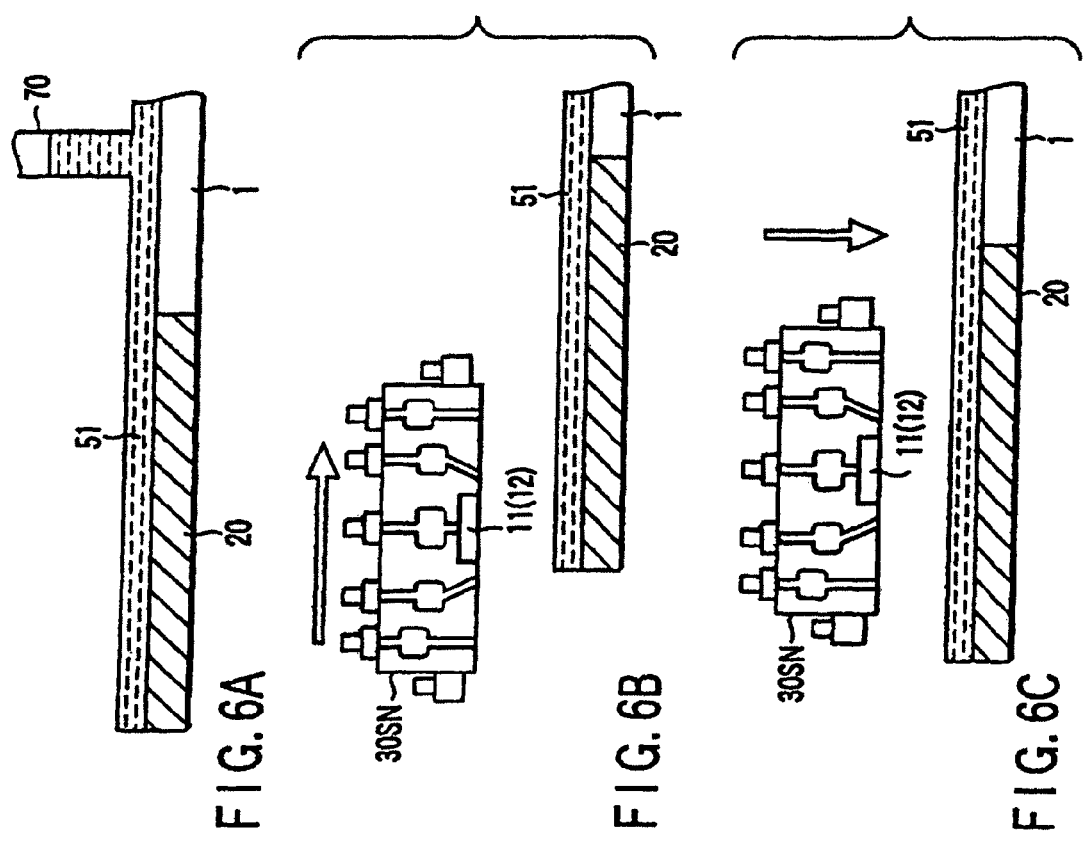

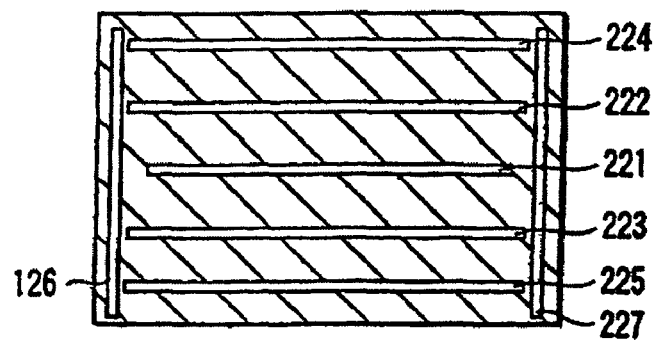
F I G. 18
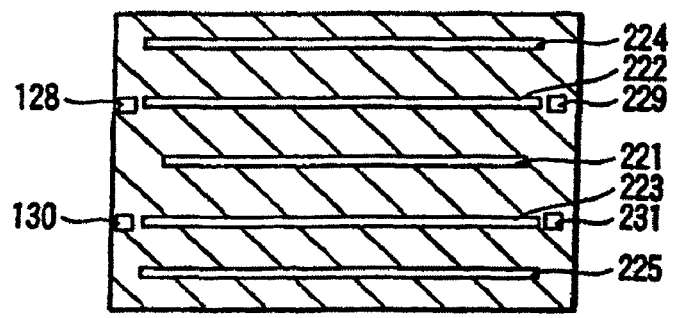
F I G. 19
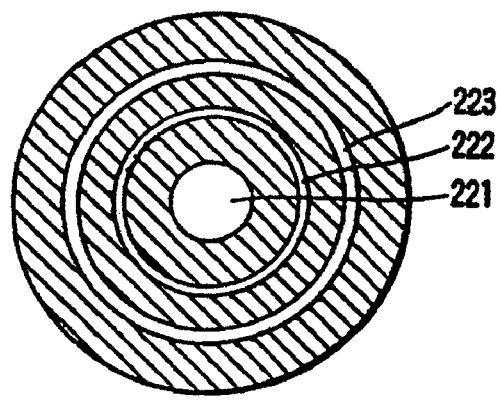
F I G. 20

APPARATUS FOR PROCESSING A SUBSTRATE

CROSS-REFERENCE TO RELATED APPLICATIONS

This application is a division of application Ser. No. 11/103,472, filed Apr. 12, 2005 now U.S. Pat. No. 7,354,869, which claims the benefit of priority to Japanese Patent Application No. 2004-118279, filed Apr. 13, 2004, and Japanese Patent Application No. 2004-189928, filed Jun. 28, 2004, the entire disclosures of which are incorporated herein by reference.

BACKGROUND OF THE INVENTION

1. Field of the Invention

The present invention relates to a substrate processing method and a substrate processing apparatus for processing a substrate with a chemical solution, and a semiconductor device manufacturing method using the same.

2. Description of the Related Art

A wet process is extensively used for a substrate processing technique in a process of manufacturing a semiconductor device or a liquid crystal display. In particular, regarding a developing process to be carried out after a photosensitive resin is photosensitized, a puddle technique has been actively studied.

In a conventional puddle technique, a chemical solution is supplied onto a substrate to be processed (target substrate) while the substrate is rotated. The chemical solution is supplied by a chemical solution supply part laid out above the substrate. However, it is very difficult for the chemical solution supply part to make uniform a dispensing pressure of the chemical solution or a chemical supply quantity per unit area at a central part and at a peripheral part of the substrate. Therefore, it has been very difficult to obtain uniform developing precision in the plane of the substrate. A problem associated with such processing precision exists similarly in a substrate processing method other than the developing process.

As developing advances, a dissolved product or a developing solution with a low concentration is generated as a byproduct of such advancement. In general, it is believed that a dissolved product or a developing solution with a low concentration inhibits dissolution of a photosensitive thin film. The dissolved product or the like is generated according to the pattern density in the substrate, and thus, is generated with a certain distribution on the substrate. Then, the dissolved product or the like is subject to a force such as a centrifugal force caused by substrate rotation, and moves on the substrate with non-uniformity. For such a reason as well, in the conventional puddle technique, it has been impossible to obtain uniform processing precision in the plane.

There is proposed a substrate processing method using a suction nozzle in order to generate the flow of a chemical solution in the course of developing. For example, in Jpn. Pat. Appln. KOKAI Publication No. 2002-252167 by the present inventors, there is proposed a nozzle comprising a chemical solution dispensing port and a chemical solution suction port and a substrate processing method using the nozzle.

The above substrate processing method is directed to a method for processing a substrate in the case where a developing solution is used as a chemical solution; namely, while dispensing the developing solution from a developing solution dispensing port, sucking the developing solution from a developing solution suction port, and then, processing the substrate while scanning the nozzle in proximity to the substrate. The above substrate processing method is one method of making a nozzle proximal to a substrate, and increasing the flow rate of a chemical on the substrate, thereby achieving replacement of the chemical between patterns, and then, reducing a pattern dimensional difference caused by a pattern density.

In a state in which the nozzle and the substrate are thus very proximal to each other, bubbles or the like exist between the nozzle and the substrate. Such bubbles cause the impairment of the uniformity of the flow of the chemical on the substrate. Specifically, the flow rate or the like of the chemical becomes different depending on an upstream side and a downstream side with respect to a position at which the bubbles exist. Therefore, there has been a demand for providing a substrate processing method and a substrate processing apparatus capable of preventing the non-uniformity of the flow of the chemical caused by the bubbles.

In addition, a wet process is used for a substrate processing technique in the steps of manufacturing a semiconductor device or a liquid crystal display. In particular, regarding the developing and etching processes after a photosensitive resin has been photosensitized, a paddle method or a spray method are actively discussed. In these methods, in general, the developing solution or etching solution has been supplied and processed on the substrate, and then, the substrate is rotated while pure water is supplied during rinse processing, thereby removing a by-product caused at the time of developing (resist residue) or metallic or organic particles and the like which may exist on the substrate. However, the by-product or particles and the like are not completely reduced, thus causing the impaired yield of photomasks or wafers.

As developing or etching advances, a dissolved product or a resist residue is produced as a by-product thereof. The product and residue float in the solution existing on the substrate, and it is believed that there is a high probability that the dissolved product, resist residue and the like exist on the vicinity of the liquid solution surface. In the latest investigation, it is found that, when the liquid on the substrate becomes thin, and then, disappears, the dissolved product, resist residue and the like existing on the liquid solution surface or in the liquid solution adhere to the substrate surface, causing a defect.

In Jpn. Pat. Appln. KOKAI Publication No. 2002-252167 described previously, there is proposed a nozzle which comprises a chemical solution dispensing port and a chemical solution sucking port and a substrate processing method using the nozzle. The document describes a case of using a developing solution as a chemical solution and relates to a method of sucking the developing solution from a developing solution sucking port while dispensing the developing solution from a developing solution dispensing port, and then, processing the substrate while carrying out scanning with the nozzle being proximal to the substrate. In more detail, by making the nozzle proximal to the substrate, the replacement of the chemical solution between patterns is achieved by increasing the flow rate of the chemical, and one method for reducing the pattern dimensional difference caused by a pattern density is provided.

A sucking part exists at the above reported nozzle. The sucking section carries out processing while sucking and removing particles such as the dissolved product or resist reside contained in the liquid solution existing on the substrate. Thus, there is an advantage that these particles can be almost removed from the top of the substrate. However, the monitoring of particles is not carried out, thus making it possible to deny a possibility that a dissolved product or a floating object such as a resist residue exists on a liquid surface.

Therefore, there is a growing demand for a technique for guaranteeing that the particles hardly exist in the liquid before drying the substrate surface. That is, there has been a demand for achieving a substrate processing method and a substrate processing apparatus capable of restricting the particles from adhering to the substrate surface after drying the substrate surface and improving the yielding.

BRIEF SUMMARY OF THE INVENTION

According to a first aspect of the invention, there is provided a method of substrate processing, which comprises:

preparing a substrate processing apparatus comprising a substrate holding mechanism to hold a target substrate to be processed having a first main face, and a chemical solution dispensing/sucking mechanism which comprises a chemical solution dispensing port to dispense a first chemical solution, and a chemical solution suction port to suck a chemical solution including the first chemical solution;

placing the target substrate on the substrate holding mechanism so as to expose the first main face;

preparing an auxiliary plate having a second main face, followed by laying out the auxiliary plate at a periphery of the target substrate such that the second main face is substantially flush with the first main face;

supplying a second chemical solution onto the first main face and the second main face;

dispensing the first chemical solution from the chemical solution dispensing port and sucking the first chemical solution and the second chemical solution through the chemical solution suction port, in a state in which the chemical solution dispensing port and the chemical solution suction port are brought into contact with the second chemical solution; and while dispensing the first chemical solution from the chemical solution dispensing port and sucking the first chemical solution through the chemical solution suction port, scanning the chemical solution dispensing/sucking mechanism in a state in which the chemical solution dispensing port and the chemical solution suction port are opposed to the first main face of the target substrate.

According to a second aspect of the invention, there is provided an apparatus for substrate processing, which comprises:

a substrate holding mechanism to hold a target substrate to be processed having a first main face;

a chemical solution dispensing/sucking mechanism including a chemical solution dispensing port to dispense a first chemical solution onto the first main face and a chemical solution suction port to suck a chemical solution including the first chemical solution;

an auxiliary plate having a second main face, the auxiliary plate being laid out at a periphery of the target substrate such that the second main face is substantially flush with the first main face; and at least one selected from the group consisting of (1) a recess portion provided on the second main face of the auxiliary plate, the recess portion being wider than an area including the chemical solution dispensing port and the chemical solution suction port, (2) a determining mechanism to determine whether a bubble is present or absent in the chemical solution dispensing port; and (3) a vibration mechanism to vibrate the first chemical solution and the second chemical solution.

According to a third aspect of the invention, there is provided a method of manufacturing a semiconductor device, which comprises:

preparing a substrate processing apparatus comprising a semiconductor wafer holding mechanism to hold a target semiconductor wafer to be processed having a first face and a chemical solution dispensing/sucking mechanism including a chemical solution dispensing port to dispense a first chemical solution and a chemical solution suction port to suck a chemical solution including the first chemical solution;

placing the target semiconductor wafer on the semiconductor wafer holding mechanism so as to expose the first main face;

preparing an auxiliary plate having a second main face, followed by laying out the auxiliary plate at the periphery of the target semiconductor wafer such that the second main face is substantially flush with the first main face;

supplying a second chemical solution onto the first main face and the second main face;

dispensing the first chemical solution from the chemical solution dispensing port and sucking the first chemical solution and the second chemical solution through the chemical solution suction port, in a state in which the chemical solution dispensing port and the chemical solution suction port are brought into contact with the second chemical solution, so as to preclude a first chemical solution from coming into contact with the first main face of the target semiconductor wafer; and while dispensing the first chemical solution from the chemical solution dispensing port and sucking the first chemical solution through the chemical solution suction port, scanning the chemical solution dispensing/sucking mechanism in a state in which the chemical solution dispensing port and the chemical solution suction port are opposed to the first main face of the target semiconductor wafer.

BRIEF DESCRIPTION OF THE SEVERAL VIEWS OF THE DRAWING

FIGS. 6A to 6F are sectional views each adopted to explain a substrate processing method according to the third embodiment;

FIGS. 15 to 20 are bottom views showing a variety of layouts of chemical solution dispensing and suction ports according to the sixth embodiment.

DETAILED DESCRIPTION OF THE INVENTION

Hereinafter, embodiments of the present invention will be described with reference to the accompanying drawings. According to the embodiments presented below, there can be provided a substrate processing method and a substrate processing apparatus capable of preventing the non-uniformity of flow of a chemical solution caused by air bubbles.

First Embodiment

Figure 1:
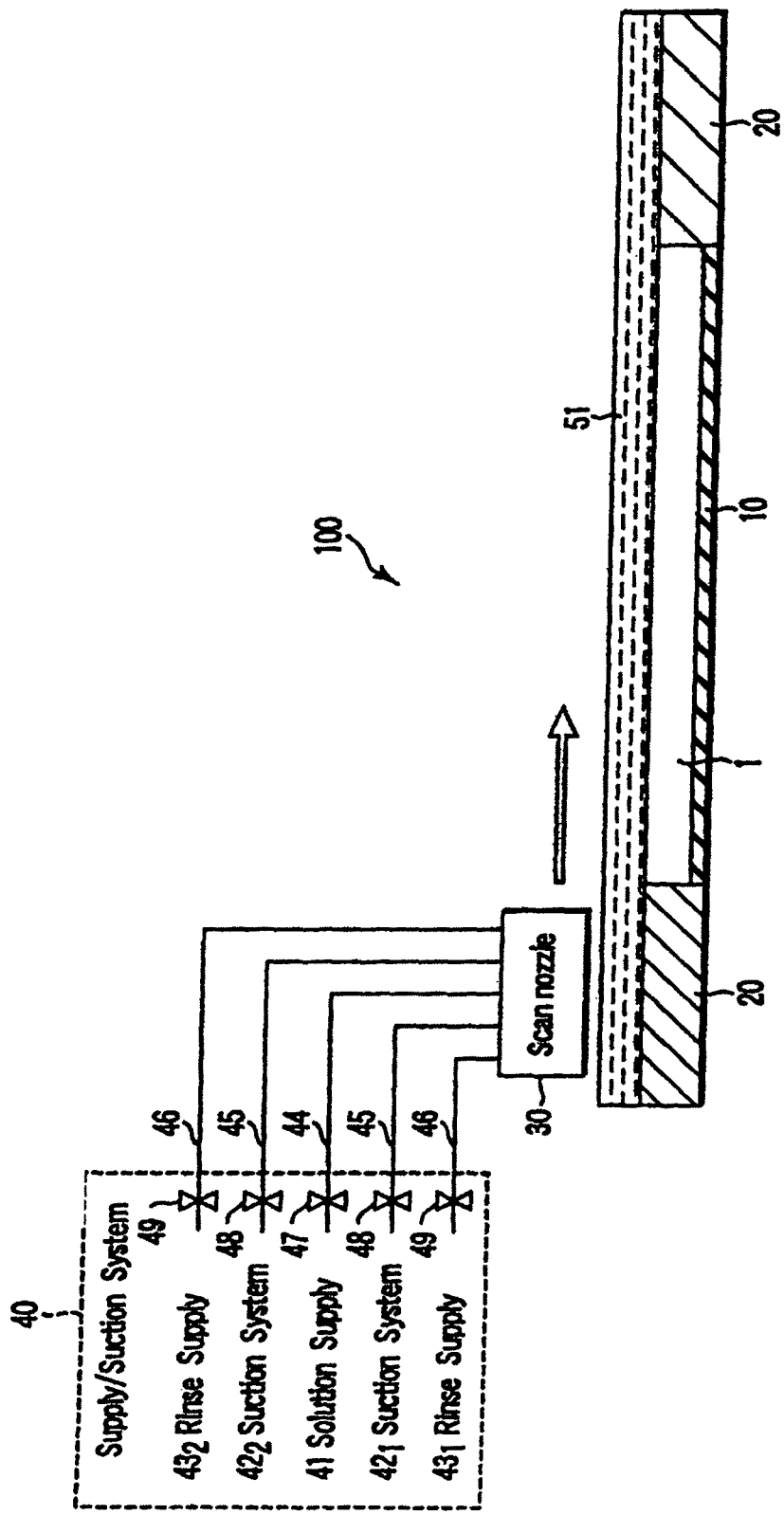
FIG. 1 is a schematic sectional view showing an outline construction of a substrate processing apparatus according to a first embodiment of the invention.
Figure 2:
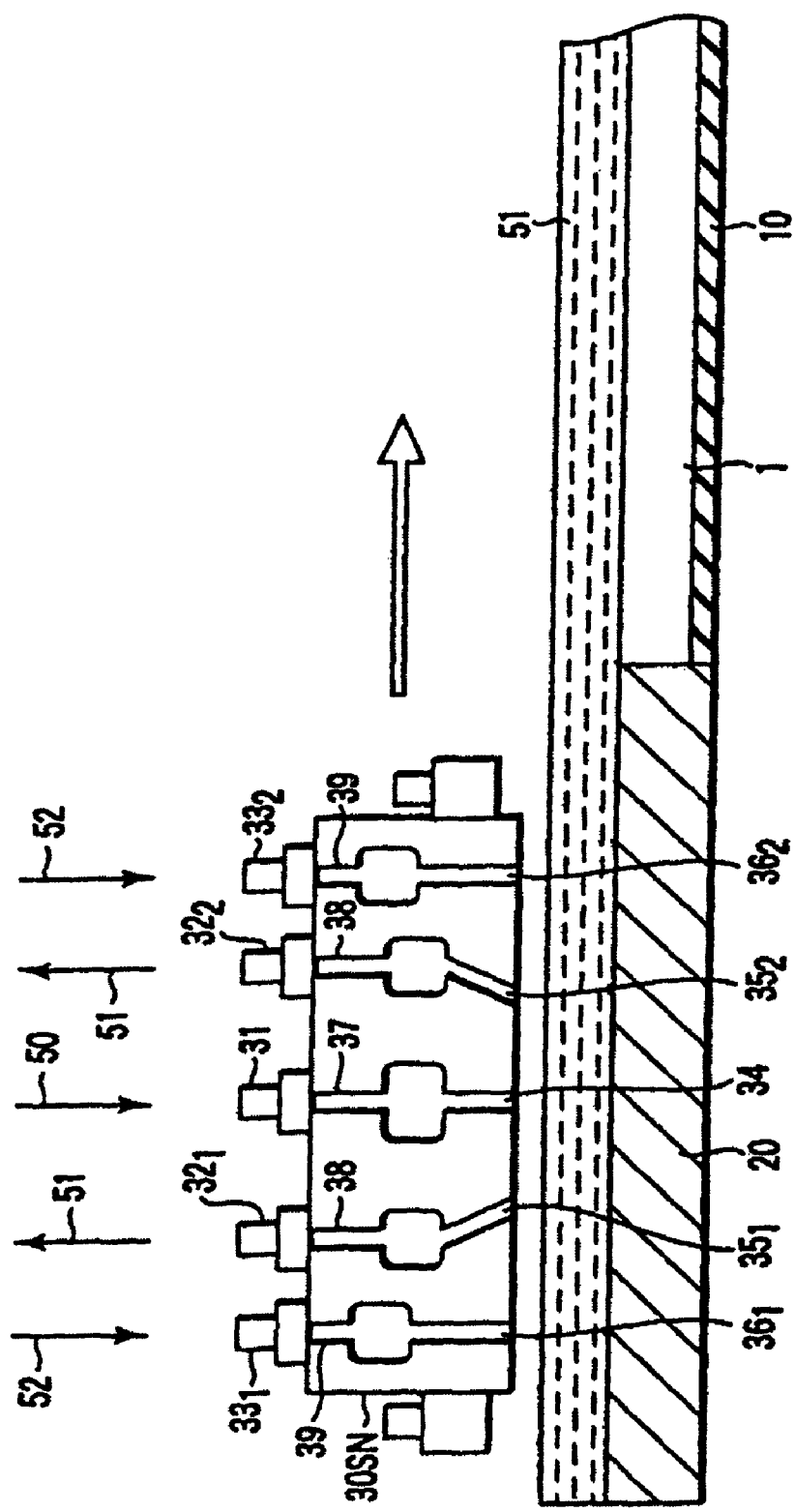
FIG. 2 is a sectional view schematically depicting an outline construction of a scan nozzle of the substrate processing apparatus according to the first embodiment.

FIG. 1 is a view schematically depicting an outline construction of a substrate processing apparatus according to a first embodiment of the present invention. FIG. 2 is a view schematically depicting an outline construction of a chemical solution dispensing/sucking mechanism of the substrate processing apparatus according to the present embodiment.

A substrate processing apparatus 100 comprises: a substrate holding mechanism 10 for holding a target substrate 1 substantially horizontally; an auxiliary plate 20 for surrounding the target substrate 1 and the substrate holding mechanism 10 and making vertical movement; a chemical solution dispensing/sucking mechanism 30 laid out above the substrate holding mechanism 10; and a chemical solution supply/suction system for supplying a chemical solution or the like into the chemical solution dispensing/sucking mechanism 30 and sucking the chemical solution or the like from the inside of the chemical solution dispensing/sucking mechanism 3.

The target substrate 1 comprises, for example, an Si wafer and a photosensitive thin film provided on the Si wafer. The substrate holding mechanism 10 is provided as a wafer holding device, for example. An upper face of the auxiliary plate 20 is set to be substantially as high as, or slightly lower than an upper face of the target substrate 1 (for example, an upper face of the photosensitive thin film).

The chemical solution dispensing/sucking mechanism 30, as shown in FIG. 2, comprises a chemical solution dispensing/sucking head (hereinafter, referred to as a scan nozzle) 30SN. At the upper side of the scan nozzle 30SN, there are provided: a chemical solution inlet 31 into which a chemical solution 50 is to be introduced; first and second liquid outlets 32$_1$, 32$_2$ which are laid out so as to sandwich the chemical solution inlet 31, the outlets causing a liquid solution 51 to be discharged therefrom; and first and second rinse solution inlets 33$_1$, 33$_2$ which are laid out at the outside of the liquid outlets 32$_1$, 32$_2$, the inlets causing a rinse solution 52 to be introduced therefrom. The chemical 50 is provided as, for example, a developing solution. The above liquid solution includes, for example, a developing solution; pure water; a developing solution and pure water; a developing solution, pure water, and a rinse solution; or a developing solution and a rinse solution.

On the other hand; at the lower side of the scan nozzle 30SN, there are provided: a slit shaped-chemical solution dispensing port 34 for supplying the chemical solution 50 onto the target substrate 1; slit shaped first and second chemical solution suction ports 35$_1$, 35$_2$ which are laid out at both sides of the chemical solution dispensing port 34, the suction ports being adopted to suck in the liquid 51 on the target substrate 1; and first and second rinse solution dispensing port 36$_1$, 36$_2$ which are laid out at the outside of the chemical solution suction ports 35$_1$, 35$_2$, the dispensing ports 36$_1$, 36$_2$ being adopted to supply the rinse solution 52 onto the target substrate 1.

The chemical solution dispensing port 34 communicates with the chemical solution inlet 31 via a pipe 37. Similarly, the liquid solution outlets 33$_1$, 33$_2$ and the rinse solution suction ports 35$_1$, 35$_2$ communicate with each other via a pipe 38; and the rinse solution inlets 33$_1$, 33$_2$ and the rinse solution dispensing ports 36$_1$, 36$_2$ communicate with each other via a pipe 39. The pipes 37, 38, 39 each comprise a liquid solution reservoir.

The chemical supply/suction system 40 comprises first and second liquid solution suction systems 42$_1$, 42$_2$ and first and second rinse supply systems 43$_1$, 43$_2$. The chemical supply system 41, the liquid solution suction systems 42$_1$, 42$_2$, and the rinse supply systems 43$_1$, 43$_2$ each communicate with the chemical solution inlet 31, the liquid solution outlets 32$_1$, 32$_2$, and the rinse solution inlets 33$_1$, 33$_2$ via pipes 44, 45 and 46. Valves 47, 48 and 49 are provided in the middle of the pipes 44, 45 and 46 each other.

By pressurizing a chemical solution canister (not shown), the chemical solution 50 is supplied into the pipe 45 via the chemical solution inlet 31, and is dispensed from the chemical solution dispensing port 34. The liquid solution suction systems 42$_1$, 42$_2$ are connected to the liquid solution outlets 32$_1$, 32$_2$, respectively, via a pump (not shown). The liquid solution is sucked in by a suction force of the pump. The rinse solution is continuously dispensed from the rinse solution dispensing ports 36$_1$, 36$_2$. In this case, a liquid solution including the chemical solution and the rinse solution is sucked into the liquid solution suction ports 35$_1$, 35$_2$.

A well known gap measuring mechanism and a gap adjusting mechanism, which are although not shown, are provided at the chemical solution dispensing/sucking mechanism 30. The substrate processing apparatus 100 further comprises a well known moving mechanism for relatively moving the chemical solution dispensing/sucking mechanism 30 and the substrate holding mechanism 10.

Figure 3A:
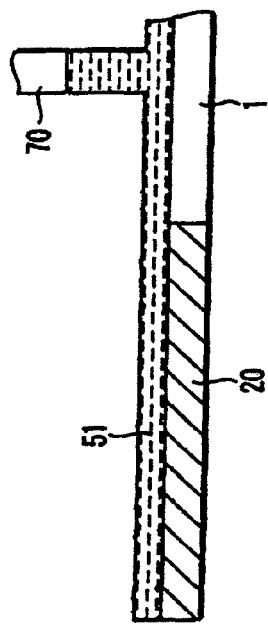
FIGS. 3A to 3E are sectional views each illustrating a substrate processing method according to the first embodiment in a stepwise manner.
Figure 3B:
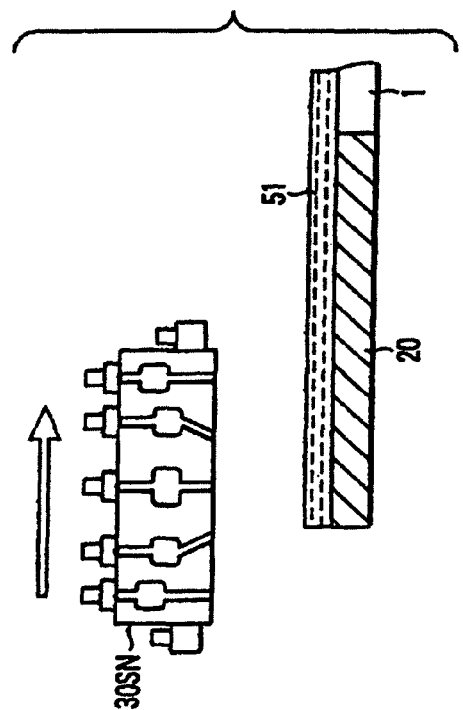
Figure 3C:
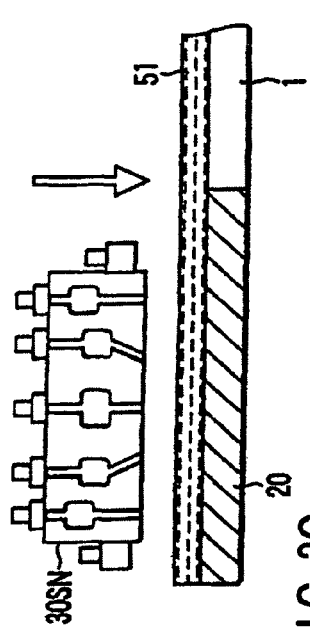
Figure 3D:
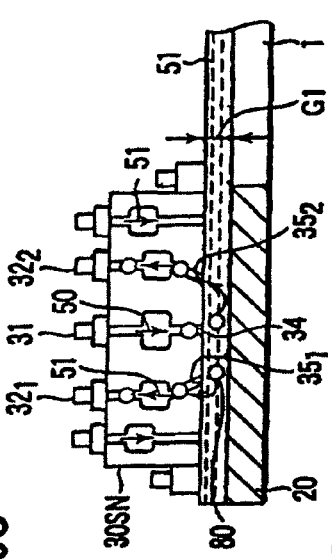
Figure 3E:
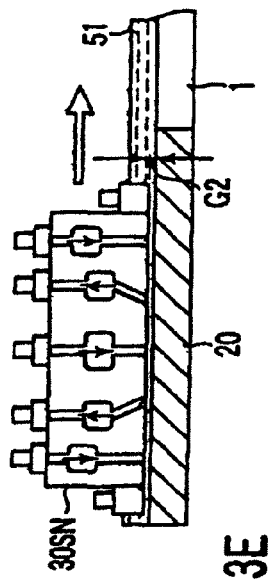

FIGS. 3A and 3E are views each adopted to explain a substrate processing method using a substrate processing apparatus according to the present embodiment. Here, a description will be given with respect to a case where the chemical liquid is a developing solution, namely, a case of a developing processing method. In the figures that follows FIG. 13A, the substrate holding mechanism 10 is omitted for clarity.

First, the target substrate 1 is prepared. The target substrate 1 comprises: a semiconductor wafer; an undercoat film provided and processed on the wafer; and a resist pattern provided on the undercoat film. The resist pattern is produced as follows. That is, a photosensitive resin film such as a resist having thickness of 0.4 micron is formed on the undercoat film, and then, with an exposure process using a KrF excimer laser stepper, a 0.10 micron pattern latent image is formed on the photosensitive resin film.

Next, the target substrate 1 is held horizontally by the substrate holding mechanism. Next, as shown in FIG. 3A, a liquid solution 51 (pure water at this stage) is filled on the target substrate 1 and the auxiliary plate 20 (first and second main faces) laid out so as to surround the target substrate 1. The liquid solution 51 (second chemical solution) is supplied from a liquid solution filling nozzle 70. When the liquid solution 51 is filled, the liquid solution filling nozzle 70 is moved from a liquid solution filling nozzle standby position (not shown) onto the target substrate 1. After the filling of the liquid solution 51 has completed, the liquid solution filling nozzle 70 is moved from the top of the target substrate 1 to the liquid solution filling nozzle standby position.

Next, as shown in FIG. 3B, the scan nozzle 30SN is moved from a scan nozzle standby position (not shown) upwardly of the auxiliary plate 20. Next, as shown in FIG. 3C, the scan nozzle 30SN moved to above the auxiliary plate 20 is fallen. Then, as shown in FIG. 3D, in a state in which a lower face (nozzle lower face) of the scan nozzle 30SN comes into contact with a liquid level of the liquid solution 51, the scan nozzle 30SN is held.

Here, at a moment at which the nozzle lower face has come into contact with the liquid level of the liquid solution 51, air bubbles 80 enter the inside of the chemical solution dispensing port 34 situated on the nozzle lower face. Therefore, in the present embodiment, in order to eliminate the air bubbles 80 from the inside of the chemical solution dispensing port 34, operations of developing solution dispensing, liquid solution sucking and rinse solution dispensing are made in a state in which the nozzle lower face has come into contact with the liquid level of the liquid solution 51. By these operations, the air bubbles 80 having entered the inside of the chemical solution dispensing port 34 are purged out from the chemical solution dispensing port 34. The air bubbles 80 purged out from the chemical solution dispensing port 34 are sucked into the chemical solution suction ports $35_1$, $35_2$ and the sucked bubbles are purged out from the liquid solution outlets $32_1$, $32_2$ to the outside of the scan nozzle 30SN.

Similarly, at a moment at which the nozzle lower face has come into contact with the liquid level of the liquid solution 51, air bubbles 80 adhered to the nozzle lower face are released from the nozzle lower face due to operations of developing solution dispensing, liquid solution sucking and rinse solution dispensing. The air bubbles 80 released from the nozzle lower face are sucked into the chemical solution suction ports $35_1$, $35_2$, and the sucked bubbles are purged out from the liquid solution outlets $32_1$, $32_2$ to the outside of the scan nozzle 30SN.

In order to reliably eliminate the air bubbles 80 having entered the inside of the chemical solution dispensing port 34 or the air bubbles 80 adhered to the nozzle lower face, it is preferable to intermittently carry out operations of the above developing solution dispensing, liquid solution sucking, and rinse solution dispensing.

It is desirable that a gap G1 between the nozzle lower face and the auxiliary plate 20 during operations of the developing solution dispensing, liquid solution sucking and rinse solution dispensing is greater than a diameter of each of the air bubbles 80 having entered the nozzle lower face. This is because, in the case where the gap G1 is equal to or greater than the diameter of the air bubbles 80, there is no need for a large amount of force to move the air bubbles 80. In actuality, it is considered desirable that the gap G1 is about 3 mm because the diameter of the air bubble 80 is about 0.1 mm to 3 mm in general. In addition, during the operations of the above developing solution dispensing, liquid solution sucking, and rinse solution dispensing, it is preferable that the developing solution dispensed from the chemical solution dispensing port 34 should not come into contact with the top of the target substrate 1. Further, it is preferable that the rinse solution dispensed from the rinse solution dispensing ports $36_1$, $36_2$ should not come into contact with the top of the target substrate 1.

Next, as shown in FIG. 3E, the scan nozzle 30SN is further lowered until a gap G2 between the nozzle lower face and the auxiliary plate 20 is obtained as a desired value, i.e., 100 microns in the present embodiment. Thereafter, while the gap G2 is held at the above desired value, the operations of developing solution dispensing, liquid solution sucking, and rinse solution dispensing are carried out, and the scan nozzle 30SN is scanned above the target substrate 1 at a speed of 1 mm per second, thereby carrying out a developing process. At this time, the scan nozzle 30SN is scanned in a state in which the chemical solution dispensing port 34, the chemical solution suction ports $35_1$, $35_2$ and the rinse solution dispensing ports $36_1$, $36_2$ are opposed to an upper face of the target substrate 1.

In the present embodiment, tetramethyl ammonium hydroxide (TMAH) (normality 0.27N) is used as a developing solution. Further, a dispensing flow rate of the developing solution, a suction flow rate of liquid solution, and a suction pressure of the liquid solution suction flow rate are adjusted in advance such that the developing solution dispensed from the chemical solution dispensing port 34 is sucked into the chemical solution suction ports $35_1$, $35_2$. Next, the target substrate 1 is rotated, and the liquid solution on the target substrate 1 is vibrated. Then, the target substrate 1 is dried, whereby a resist pattern forming process completes.

When the in-plane uniformity of a resist pattern formed in accordance with the method of the embodiment was measured, a result of 2.7 nm (3σ) was obtained. On the other hand, when the in-plane uniformity of the resist pattern formed in accordance with the conventional technique (developing without elimination of air bubbles 80) was measured, a result of 7.5 nm (3σ) was obtained. From the above results, it was verified that a resist pattern having significantly improved uniformity can be provided according to the embodiment.

After the scan nozzle 30SN had been fabricated of a transparent element material, when the presence of air bubbles or foreign objects (dust and/or particles) in the chemical solution dispensing port 34 and the presence of air bubbles or foreign objects adhered to the nozzle lower face were monitored, it was successfully verified that the number of air bubbles and foreign objects can be reduced to 0 by using the embodiment.

As has been described above, according to the present embodiment, the dispensing and sucking of the processing liquid solution (chemical solution, rinse solution) are carried out while a gap greater than the diameter of air bubble 80 is maintained on the auxiliary substrate 20 laid out at the periphery of the target substrate 1. This makes it possible to eliminate (bubble-remove) the air bubbles or foreign objects which exist in the chemical solution dispensing port 34 and the air bubbles or foreign objects adhered to the nozzle lower face by means of sucking operation.

In the present embodiment, a bubble removing process is carried out while the nozzle lower face comes into contact with a liquid level above the auxiliary plate 20. In this manner, the bubble removing process can be carried out while avoiding the outflow of the processing liquid solution onto the target substrate 1 before substrate processing. After the bubble removing process has completed, the scan nozzle 30SN is moved upwardly of the target substrate 1 in a state in which the nozzle comes into contact with the liquid level, and substrate processing is carried out. Accordingly, there is little possibility of new entry of air bubbles or the like.

Second Embodiment

FIG. 4 is a view adopted to explain a substrate processing method using a substrate processing apparatus according to a second embodiment of the invention. Here, a description will be given with respect to a case where a chemical solution is a developing solution, namely, a case of a developing processing method. Like constituent elements in FIGS. 1 to 3E are designated by like reference numerals, and a detailed description is omitted here. In the following figures, like constituent elements in the existing figures are designated by like reference numerals, and a detailed description is omitted here.

A substrate processing apparatus according to this embodiment is different from that of the first embodiment in that the auxiliary plate 20 comprises a recess portion 21 which is greater by one round than an area in which there exist the chemical solution dispensing port 34, the liquid solution suction ports $35_1$, $35_2$ and the rinse solution dispensing port $36_1$, $36_2$. In the embodiment, the depth of the recess portion 21 is 5 nm. In addition, a substrate processing method according to the present embodiment is different from that of the first embodiment in that air bubbles are eliminated in the recess portion 21. Hereinafter, the present embodiment will be described in detail.

First, as in the first embodiment, the target substrate 1 comprising a wafer, an undercoat film, and a resist pattern is prepared. Then, the target substrate 1 is held horizontally by the substrate holding mechanism.

Figure 4A:
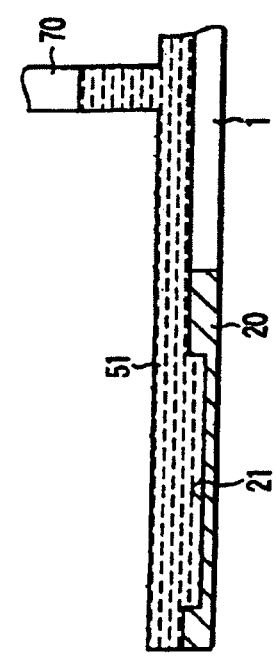
FIGS. 4A to 4E are sectional views each illustrating a substrate processing method according to a second embodiment in a stepwise manner.

Next, as shown in FIG. 4A, as in the first embodiment, the liquid solution 51 is filled on the target substrate 1 and the auxiliary plate 20 laid out so as to surround the target substrate 1.

Figure 4C:
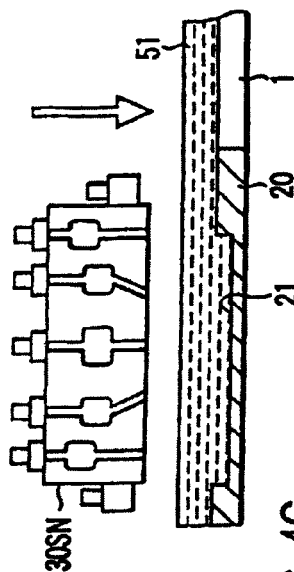
Figure 4D:
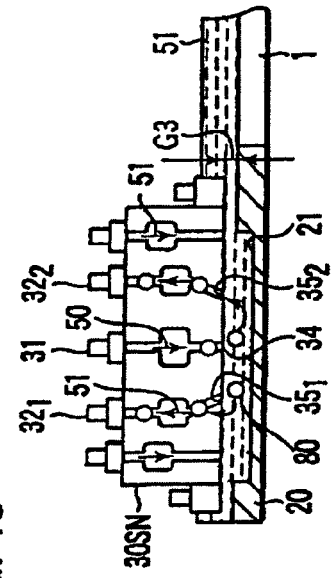
Figure 4E:
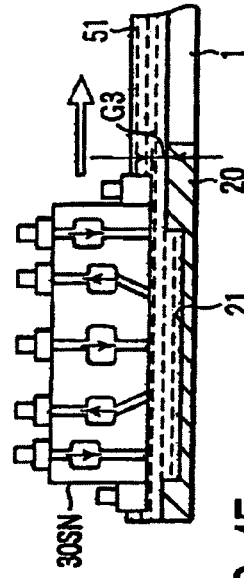
Figure 4B:
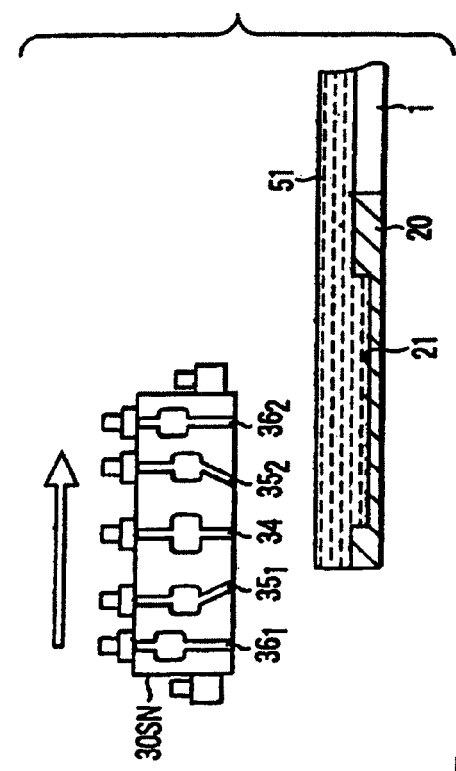

Next, as shown in FIG. 4B, the scan nozzle 30SN is moved from a nozzle standby position (not shown) upwardly of the auxiliary plate 20. At this time, when seen from the top of the scan nozzle 30SN, the position of the scan nozzle 30SN is set at a position such that a region in which there exist the chemical solution dispensing port 34, the liquid solution suction ports $35_1$, $35_2$, and the rinse solution dispensing ports $36_1$, $36_2$ is included in the recess portion 21 provided on the surface of the auxiliary plate 20.

Next, as shown in FIG. 4C, the scan nozzle 30SN moved onto the auxiliary plate 20 is fallen. Then, as shown in FIG. 4D, the scan nozzle 30SN is held in a state in which the nozzle lower face comes into contact with the liquid level of the liquid solution 51. At this time, a gap G3 between the nozzle lower face and the auxiliary plate 20 is substantially equal to the gap G2 in the first embodiment.

Here, at a moment at which the nozzle lower face has come into contact with the liquid level of the liquid solution 51, air bubbles 80 enters the inside of the chemical solution dispensing port 34 situated on the nozzle lower face. Then, in the embodiment, in order to eliminate the air bubbles 80 from the inside of the chemical solution dispensing port 34, operations of developing solution dispensing, liquid solution sucking, and rinse solution dispensing are carried out in a state in which the nozzle lower face has come into contact with the liquid level of the liquid solution 51. By these operations, the air bubbles 80 having entered the inside of the chemical solution dispensing port 34 are purged out from the chemical solution dispensing port 34. The air bubbles 80 purged out from the chemical solution dispensing port 34 are sucked into the chemical solution suction ports $35_1$, $35_2$, and then, the sucked air bubbles are purged out from the liquid-solution outlets $32_1$, $32_2$ to the outside of the scan nozzle 30SN.

Similarly, at a moment at which the nozzle lower face has come into contact with the liquid level of the liquid solution 51, the air bubbles 80 adhered to the nozzle lower face are also released from the nozzle lower face by the above operations of developing solution dispensing, liquid solution sucking, and rinse solution dispensing. Then, the air bubbles 80 released from the nozzle lower face are sucked into the chemical solution suction ports $35_1$, $35_2$, and the sucked air bubbles are purged out from the liquid solution outlets $32_1$, $32_2$ to the outside of the scan nozzle 30SN.

In order to reliably eliminate the air bubbles 80 having entered the inside of the chemical solution dispensing port 34 or the air bubbles 80 adhered to the nozzle lower face, it is preferable to intermittently carry out the above operations of developing solution dispensing, liquid solution sucking, and rinse solution dispensing.

Next, as shown in FIG. 4E, the operations of developing solution dispensing, liquid solution sucking, and rinse liquid solution dispensing are carried out without changing the gap G3 (=G2) between the nozzle lower face and the auxiliary plate 20, and the scan nozzle 30SN is scanned above the target substrate 1 at a speed of 1 mm per second, thereby carrying out a developing process.

In this embodiment, TMAH (normality 0.27N) is used as a developing solution. Further, a dispensing flow rate of the developing solution, a suction flow rate of liquid solution, and a suction pressure of the liquid solution suction flow rate are adjusted in advance such that the developing solution dispensed from the chemical solution dispensing port 34 is sucked into the chemical solution suction ports $35_1$, $35_2$. Next, the target substrate 1 is rotated, and the liquid solution on the target substrate 1 is vibrated. Then, the target substrate 1 is dried, whereby a resist pattern forming process completes.

When the in-plane uniformity of a resist pattern formed in accordance with the method of the embodiment was measured, a result of 2.7 nm (3σ) was obtained. On the other hand, when the in-plane uniformity of the resist pattern formed in accordance with the conventional technique (developing without elimination of air bubbles 80) was measured, a result of 7.5 nm (3σ) was obtained. From the above results, it was verified that a resist pattern having significantly improved uniformity can be provided according to the embodiment.

When the scan nozzle 30SN was fabricated of a transparent element material, and the presence of air bubbles or foreign objects (dust and/or particles) in the chemical solution dispensing port 34 and the presence of air bubbles or foreign objects adhered to the nozzle lower face were monitored, it was successfully verified that the number of air bubbles and foreign objects can be reduced to 0 by using the present embodiment.

Also in this embodiment, advantageous effect similar to that of the first embodiment can be attained. Further, according to the embodiment, in a state in which a region in which there exist the chemical solution dispensing port 34, the liquid solution suction ports $35_1$, $35_2$, and the rinse solution dispensing ports $36_1$, $36_2$ is included in the recess portion 21 of the auxiliary plate 20 when seen from the top, the dispensing and sucking of the processing liquid solution (nozzle operation) are carried out, thereby making it possible to carry out a bubble removing process more efficiently. In addition, there is another advantageous effect that the number of recipes for carrying out nozzle operation is reduced, and the bubble removing process can be easily carried out.

In order to improve the advantageous effect of the present embodiment, an auto cleaning machine and/or a liquid solution removing mechanism etc. may be used to prevent a foreign object or the like from being accumulated in the recess portion 21.

Third Embodiment

Figure 5A:
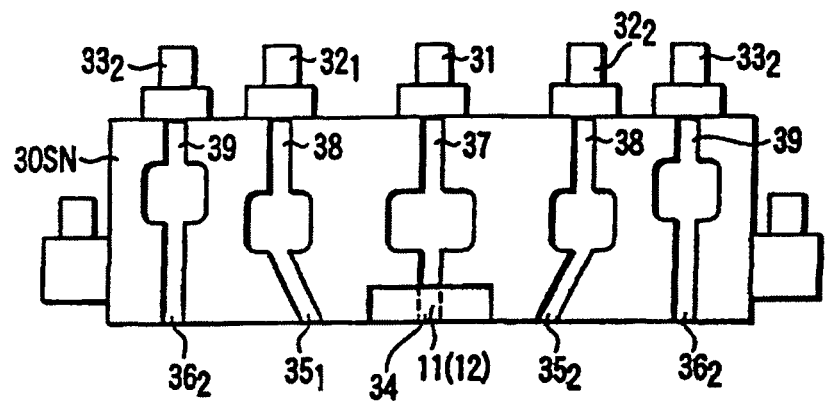
FIG. 5A is a sectional view showing a scan nozzle of a substrate processing apparatus according to a third embodiment of the invention.
Figure 5B:
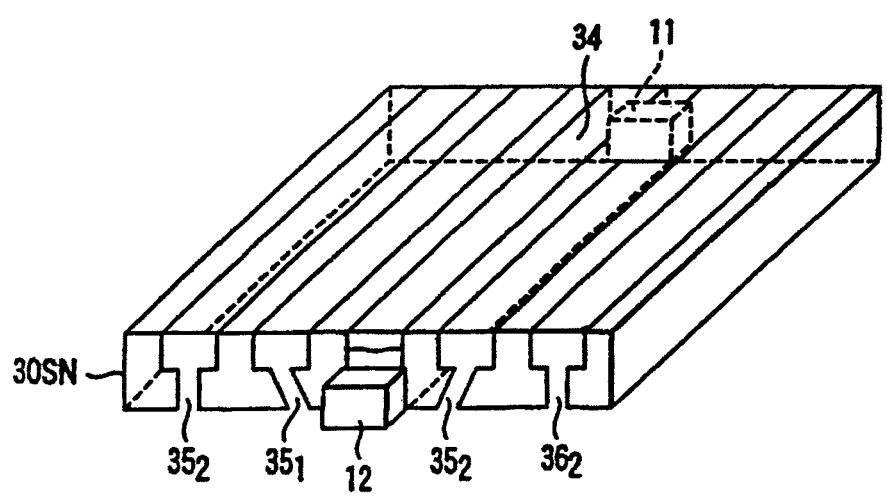
FIG. 5B is a perspective view showing the scan nozzle of the substrate processing apparatus according to the third embodiment.

FIGS. 5A and 5B are views each showing a scan nozzle of a substrate processing apparatus according to a third embodiment of the invention. FIG. 5A is a view schematically showing an outline construction of the scan nozzle, and FIG. 5B is a perspective view of the scan nozzle.

The substrate processing apparatus according to the embodiment is different from that of the first embodiment in that the scan nozzle 30SN comprises a light source 11 and a light receiving part 12 (light receiving element). The light source 11 comprises, for example, a laser. The light receiving part 12 comprises, for example, a photo diode.

The light source 11 is provided at one end of a slit shaped chemical solution dispensing port 34, and the light receiving part 12 is provided at the other end of the chemical solution dispensing port 34. An optical axis alignment is obtained such that the light emitted from the light source 11 transmits the chemical solution dispensing port 34 and is received by the light receiving part 12.

An optical system including the light source 11 and the light receiving part 12 may not always be directly mounted on the scan nozzle 30SN. The optical system may be mounted on a device other than the scan nozzle 30SN as long as the light beams radiated from the light source 11 propagate so as to transmit the chemical solution dispensing port 34 and the light receiving part 12 can measure the transmitted light quantity, a scattered light quantity, a reflection light quantity, or the like.

FIGS. 6A to 6F are views each adopted to explain a substrate processing method using the substrate processing apparatus of the embodiment. Here, a description will be given with respect to a case in which a chemical solution is a developing solution, namely, a case of a developing processing method.

First, the target substrate 1 is prepared. The target substrate 1 comprises: a wafer; an undercoat film provided and processed on the wafer; and a resist pattern provided on the undercoat film. The resist pattern is produced as follows. That is, a photosensitive resin film such as a resist having thickness of 0.3 micron is formed on the undercoat layer. Then, in accordance with an exposure process using an ArF excimer stepper, a 0.07 micron pattern latent image is formed on the photosensitive resin film.

Next, the target substrate 1 is held horizontally by the substrate holding mechanism 10. Next, as shown in FIG. 6A, the liquid solution 51 (pure water at this stage) is filled on the target substrate 1 and the auxiliary plate 20 laid out so as to surround the target substrate 1.

Subsequently, as shown in FIG. 6B, the scan nozzle 30SN is moved from a scan nozzle standby position (not shown) upwardly of an auxiliary plate 20. Next, as shown in FIG. 6C, the scan nozzle moved onto the auxiliary plate 20 is fallen. Then, as shown in FIG. 6D, the scan nozzle 30SN is held in a state in which a lower face (nozzle lower face) of the scan nozzle 30SN has come into contact with the liquid level of the liquid solution 51. At this time, a gap G1 between the nozzle lower face and the auxiliary plate 20 is set to, for example, 3 mm.

Here, at a moment at which the nozzle lower face has come into contact with the liquid level of the liquid solution 51, air bubbles 80 enter the inside of the chemical solution dispensing port 34 situated on the nozzle lower face. Therefore, in the embodiment, in order to eliminate the air bubbles 80 from the inside of the chemical solution dispensing port 34, operations of developing solution dispensing, liquid solution sucking and rinse solution dispensing are made in a state in which the nozzle lower face has come into contact with the liquid level of the liquid solution 51. By these operations, the air bubbles 80 having entered the inside of the chemical solution dispensing port 34 are purged out from the chemical solution dispensing port 34. The air bubbles 80 purged out from the chemical solution dispensing port 34 are sucked into the chemical solution suction ports $35_1$, $35_2$, and the sucked bubbles are purged out from the liquid solution outlets $32_1$, $32_2$ to the outside of the scan nozzle 30SN.

Similarly, at a moment at which the nozzle lower face has come into contact with the liquid level of the liquid solution 51, the air bubbles 80 adhered to the nozzle lower face are also released by the above operations of developing solution dispensing, liquid solution sucking, and rinse solution dispensing. Then, the air bubbles 80 released from the nozzle lower face are sucked into the chemical solution suction ports $35_1$, $35_2$, and the sucked air bubbles are purged out from the liquid solution outlets $32_1$, $32_2$ to the outside of the scan nozzle 30SN.

Next, the above-described operations of developing solution dispensing, liquid solution sucking, and rinse solution dispensing are terminated, and then, light is radiated from the light source 11 provided at one end of the chemical solution dispensing port 34. The light radiated from the light source 11 propagates the inside of the chemical solution dispensing port 34 in its longitudinal direction. The propagated light is received by the light receiving part 12 provided at the other end of the chemical solution dispensing port 34. The light receiving part 12 outputs a current which corresponds to the received light quantity. This current is measured by a measuring instrument (not shown). The measurement result is sent to a scan nozzle control part (not shown).

In the embodiment, the above light quantity was 1200 (arbitrary unit (a.u.)). On the other hand, a light quantity (reference value) which had been measured in advance was 1240 (a.u.), which is the light quantity of the light received by the light receiving part 12, the light being radiated from the light source 11 in a state in which no air bubbles were included in the chemical solution dispensing port 34 and the inside of the dispensing port was filled with the developing solution. The light quantity (1240 (a.u.)) is stored as a reference value in advance in a scan nozzle control part (not shown).

In the embodiment, after the above-described operations of developing solution dispensing, liquid solution sucking, and rinse solution dispensing have been completed, the light quantity of the light received at the light receiving part 12 and the light quantity defined as a reference value are compared with each other by the scan nozzle control part. As a result of the comparison, in the case where the values of these light quantities are equal to each other, processing goes to the step shown in FIG. 6E. On the other hand, in the case where they are not equal, the above-described operations of developing solution dispensing, liquid solution sucking, and rinse solution dispensing are carried out again. That is, the operations of developing solution dispensing, liquid solution sucking, and rinse solution dispensing are repeated until it has been determined that no air bubbles exist in the chemical solution dispensing port 34.

In the case where it has been determined that no air bubbles exist in the chemical solution dispensing port 34, as shown in FIG. 6E, the scan nozzle 30SN is further fallen until a gap G2 between the nozzle lower face and the auxiliary plate 20 has been set at a desired value, 50 microns in this embodiment. Then, while the gap G2 is held at the above desired value, the operations of developing solution dispensing, liquid solution sucking, and rinse solution dispensing are carried out, and the scan nozzle 30SN is scanned above the target substrate 1 at a speed of 1 mm per second, thereby carrying out a developing process.

In the present embodiment, TMAH (normality 0.27N) is used as a developing solution. Further, a dispensing flow rate of the developing solution, a suction flow rate of liquid solution, and a suction pressure of the liquid solution suction flow rate are adjusted in advance such that the developing solution dispensed from the chemical solution dispensing port 34 is sucked into the chemical solution suction ports $35_1$, $35_2$.

Next, the target substrate 1 is rotated, and the liquid solution on the target substrate 1 is vibrated. Then, the target substrate 1 is dried, whereby a resist pattern forming process completes.

When the in-plane uniformity of a resist pattern formed in accordance with the method of the embodiment was measured, a result of 2.7 nm (3σ) was obtained. On the other hand, when the in-plane uniformity of the resist pattern formed in accordance with the conventional technique (developing without elimination of air bubbles 80) was measured, a result of 7.5 nm (3σ) was obtained. From the above results, it was verified that a resist pattern having significantly improved uniformity can be provided according to the embodiment.

According to the present embodiment, advantageous effect similar to that according to the first embodiment can be attained. Further, according to the embodiment, there can be provided advantageous effect that a developing process can be carried out after it has been verified that no air bubbles exist in the chemical solution dispensing port 34 by using the scan nozzle 30SN comprising the light source 11 and the light receiving part 12. That is, according to the present embodiment, the developing process can be carried out in a state in which no air bubbles reliably exist in the chemical solution dispensing port 34, thereby making it possible to reliably prevent the non-uniformity of the flow of the chemical solution caused by the air bubbles.

In the embodiment, although the auxiliary plate 20 according to the first embodiment has been used, the auxiliary plate 20 according to the second embodiment, namely, the auxiliary plate 20 comprising the recess portion 21 may be used. In this case, the bubble removing process is carried out in the same manner as that in the second embodiment except a process for determining the presence or absence of air bubbles in the chemical solution dispensing port 34. The sensitivity adjustment of the optical system including the light source 11 and the light receiving part 12 is periodically carried out.

Fourth Embodiment

FIGS. 7A to 7D are views each adopted to explain a substrate processing method according to a fourth embodiment of the invention. In more detail, these figures are views each adopted to explain a method for making operations of developing solution dispensing, liquid solution sucking, and rinse solution dispensing in the third embodiment.

First, as in the third embodiment, up to the processes shown in FIG. 6C are carried out. Next, the scan nozzle 30SN is held in a state in which a lower face (nozzle lower face) of the scan nozzle 30SN has come into contact with the liquid level of the liquid solution 51.

Here, at a moment at which the nozzle lower face has come into contact with the liquid level of the liquid solution 51, air bubbles 80 enter the inside of the chemical solution dispensing port 34 situated on the nozzle lower face. Then, in the embodiment, in order to eliminate the air bubbles 80 from the inside of the chemical solution dispensing port 34, operations of developing solution dispensing, liquid solution sucking, and rinse solution dispensing (dispensing/sucking operations) are carried out in a state in which the nozzle lower face has come into contact with the liquid level of the liquid solution 51, as shown in FIGS. 7A to 7D. Here, these operations will be described in more detail.

Figure 7A:
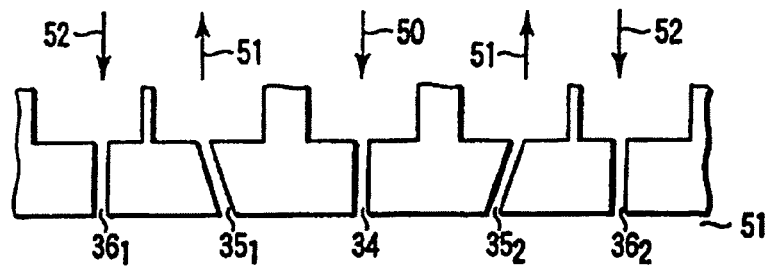
FIGS. 7A to 7D are sectional views each adopted to explain an operation of developing solution dispensing, liquid suction, and rinse solution dispensing according to a fourth embodiment of the invention.

First, as shown in FIG. 7A, dispensing/sucking operation is carried out for 5 seconds in all the chemical solution dispensing port 34, the chemical solution suction ports $35_1$, $35_2$, and the rinse solution dispensing ports $36_1$, $36_2$.

At this time, in the case where air bubbles have existed immediately beneath the chemical solution dispensing port 34, the air bubbles are sucked from the chemical solution suction ports $35_1$, $35_2$ with a substantially equal suction force. Thus, the above air bubbles cannot be sometimes removed while the bubbles are kept at their same position.

Figure 7B:
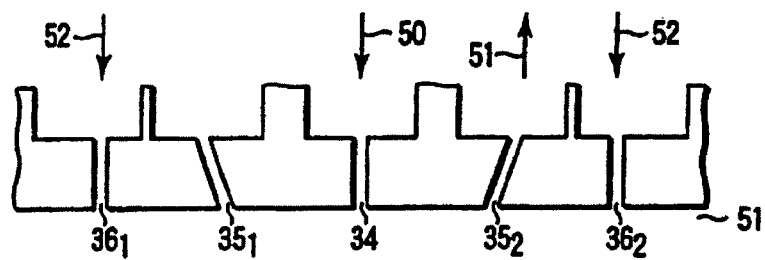

Next, as shown in FIG. 7B, dispensing/sucking operation is further carried out for 5 second in all the ports excluding the chemical solution suction port $35_1$. At this time, in the case where air bubbles have existed immediately beneath the chemical solution suction port 34, the sucking by the chemical solution suction port $35_1$ stops. Thus, the above air bubbles are sucked by the inside of the chemical solution suction port $35_2$, and the sucked bubbles are removed.

Figure 7C:
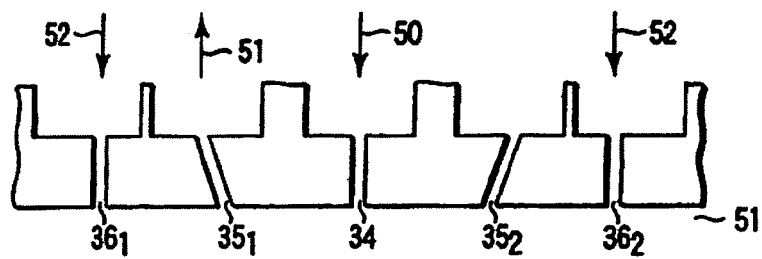

Next, as shown in FIG. 7C, dispensing/sucking operation is further carried out for 5 seconds in all the ports excluding the chemical solution suction port $35_2$. At this time, in the case where air bubbles have existed immediately beneath the chemical solution suction port 34, the sucking by the chemical solution suction port $35_2$ stops. Thus, the residual air bubbles are sucked into the chemical solution suction port $35_1$, and the sucked bubbles are removed.

Next, as in the third embodiment, light is radiated from the light source 11 provided at one end of the chemical solution dispensing port 34. The light is received at the light receiving part 12 provided at one end of the chemical solution dispensing port 34. Further, the light quantity of the received light and the light quantity 1240 (au.) defined as a reference value are compared with each other. In this embodiment, the light quantity of the received light was 1150 (a.u.).

Figure 7D:
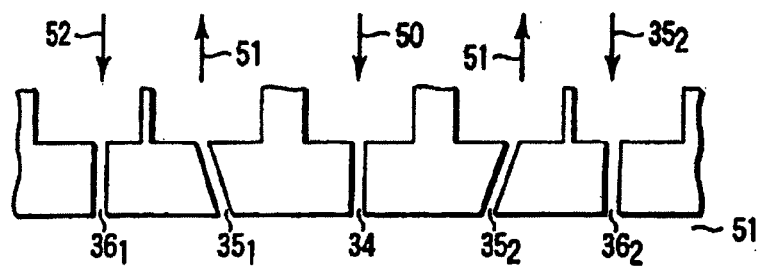

Then, as shown in FIG. 7D, dispensing/sucking operation was carried out for 5 seconds in all the ports of the chemical solution dispensing part 34, the chemical solution suction ports $35_1$, $35_2$, and the rinse solution dispensing ports $36_1$, $36_2$. Then, light was radiated from the light source 11, the light was received at the light receiving port 12, and then, the light quantity was measured.

As a result, the light quantity was 1240 (a.u.) which is equal to a reference value. That is, it was determined that no air bubbles exist in the chemical solution suction port $35_2$. The dispensing/sucking operation shown in FIGS. 7A to 7C may be carried out instead of the dispensing/sucking operation shown in FIG. 7D. The dispensing/sucking operation according to the present embodiment is repeated until it has been determined that no air bubbles exist in the chemical solution suction port $35_2$.

Then, a process (FIGS. 6E and 6F) which is similar to that according to the third embodiment is carried out, and a developing process terminates.

When the in-plane non-uniformity of the resist pattern formed in accordance with the method of the embodiment was measured, a result of 2.7 nm (3σ) was obtained. On the other hand, when the in-plane uniformity of the resist pattern formed in accordance with the conventional technique (developing without elimination of air bubbles 80) was measured, a result of 7.5 nm (3σ) was obtained. From the above results, it was verified that a resist pattern having significantly improved uniformity can be provided according to the embodiment.

According to the embodiment, advantageous effect similar to that according to the third embodiment can be attained. Further, according to the embodiment, dispensing/sucking operation is carried out such that air bubbles hardly remain in the chemical solution dispensing port 34, thus making it possible to more effectively prevent the non-uniformity of the flow of the chemical solution caused by the air bubbles.

The dispensing/sucking operation according to the present embodiment can be applied to the first embodiment, the second embodiment, and further, a fifth embodiment described later. Furthermore, this operation can be applied to a substrate processing apparatus and a substrate processing method which do not use an auxiliary plate.

In addition, a combination example of dispensing/sucking operation is not limited to that of the embodiment. Various modifications can occur depending on the number of dispensing ports, the number of suction ports, or their arrangement sequences, of the scan nozzle 30N. That is, any construction may be provided as long as it can change the pressure or flow of a liquid solution in the left and right regions which sandwich the suction port in order to remove the air bubbles in the dispensing port.

Fifth Embodiment

Figure 8:
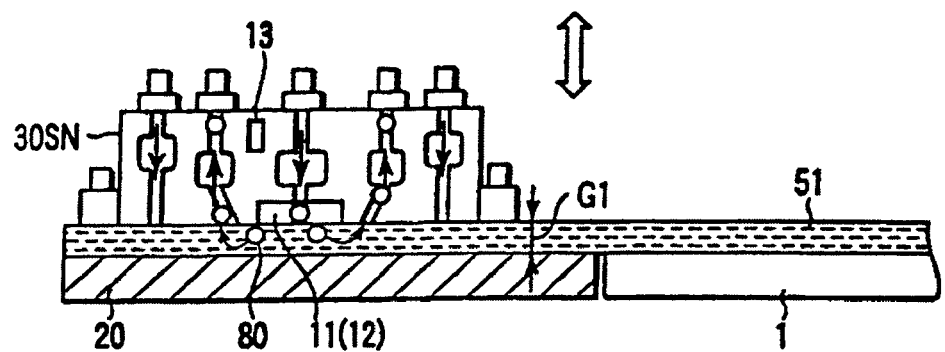
FIG. 8 is a sectional view schematically depicting an outline construction of a substrate processing apparatus according to a fifth embodiment.

FIG. 8 is a view schematically depicting an outline construction of a substrate processing apparatus according to a fifth embodiment of the invention. The substrate processing apparatus according to this embodiment is different from that of the third embodiment in that a vibrator 13 is incorporated in the scan nozzle 30SN.

The vibrator 13 can be vibrated by selecting any arbitrary one of a plurality of vibration frequencies. The above vibration frequency is not limited in particular as long as it does not affect pattern dimensions in the target substrate 1.

Now, a description will be given with respect to a substrate processing method using the substrate processing apparatus of the embodiment. Here, a description will be given with respect to a case where the chemical liquid is a developing solution, namely, a case of a developing processing method.

First, as in the third embodiment, the liquid solution 51 is filled on the target substrate 1 and the auxiliary plate 20 laid out so as to surround the target substrate 1. Next, the scan nozzle 30SN is moved from a scan nozzle standby position (not shown) upwardly of the auxiliary plate 20. Then, the scan nozzle 30SN is fallen, and the scan nozzle 30SN is held in a state in which the nozzle lower face has come into contact with the liquid level of the liquid solution 51. At this time, a gap G1 between the nozzle lower face and the auxiliary plate 20 is set to, for example, 4 mm.

Here, at a moment at which the nozzle lower face has come into contact with the liquid level of the liquid solution 51, air bubbles 80 enter the inside of the chemical solution dispensing port 34 situated on the nozzle lower face. Therefore, in the present embodiment, in order to remove the air bubbles 80 from the inside of the chemical solution dispensing port 34, operations of developing solution dispensing, liquid solution sucking, and rinse solution dispensing (dispensing/suction operations) are carried out in a state in which the nozzle lower face has come into contact with the liquid level of the liquid solution 51 and the vibrator 13 is operated to vibrate the scan nozzle 31. In more detail, the dispensing/sucking operation is carried out for 5 second and five times for all the ports of the chemical solution dispensing port 34, the chemical solution suction ports $35_1$, $35_2$ and the rinse solution dispensing ports $36_1$, $36_2$.

Next, light is radiated from the light source 11 provided at one end of the chemical solution dispensing port 34. Then, the light is received at the light receiving section 12 provided at one end of the chemical solution dispensing port 34. Further, the light quantity of the received light and the light quantity 1240 (a.u.) defined as a reference value are compared with each other. In the embodiment, the light quantity of the received light was 1240 (a.u). That is, it was determined that no air bubbles exist in the chemical solution dispensing port $35_2$.

Next, the scan nozzle 30SN is further lowered until a gap between the nozzle lower face and the auxiliary plate 20 is obtained as a desired value, i.e., 100 microns in the present embodiment. Thereafter, while the gap is held at the above desired value, the operations of developing solution dispensing, liquid solution sucking, and rinse solution dispensing are carried out, and the scan nozzle 30SN is scanned above the target substrate 1 at a speed of 3 mm per second, thereby carrying out a developing process.

Next, the target substrate 1 is rotated, and the liquid solution on the target substrate is vibrated. Then, the target substrate 1 is dried, whereby a process for forming a resist pattern completes.

When the in-plane uniformity of a resist pattern formed in accordance with the method of the embodiment was measured, a result of 2.7 nm (3σ) was obtained. On the other hand, when the in-plane uniformity of the resist pattern formed in accordance with the conventional technique (developing without elimination of air bubbles 80) was measured, a result of 7.5 nm (3σ) was obtained. From the above results, it was verified that a resist pattern having significantly improved uniformity can be provided according to the embodiment.

According to the embodiment, advantageous effect similar to that according to the third embodiment can be attained. Further, according to the embodiment, the scan nozzle 30SN is vibrated by the vibrator 13 during dispensing/sucking operation. In this manner, the air bubbles in the chemical solution dispensing port 34 can be effectively moved, thus making it possible to more effectively remove the air bubbles.

In addition, the substrate processing apparatus and the substrate processing method using the vibrator according to the embodiment can be applied to any of the first, second, and fourth embodiments.

Figure 9:
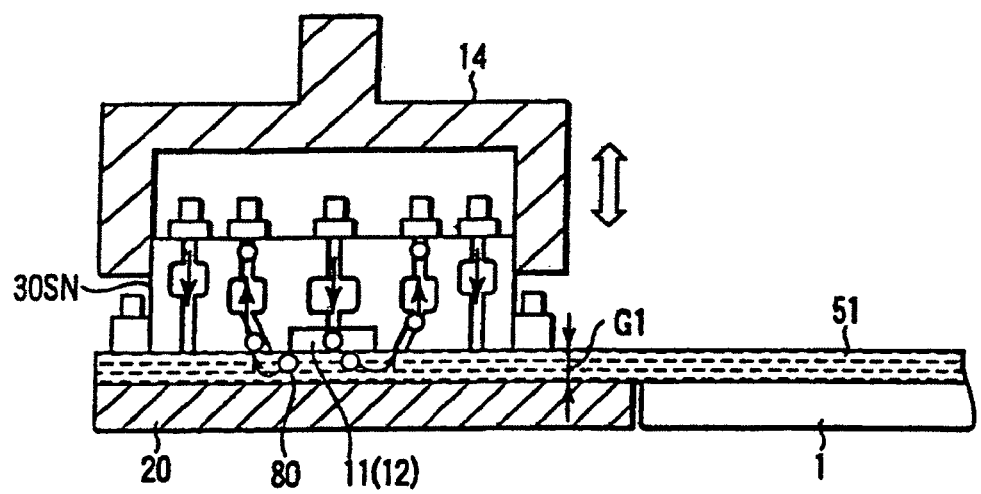
FIG. 9 is a sectional view adopted to explain a modified example of the fifth embodiment.
Figure 10:
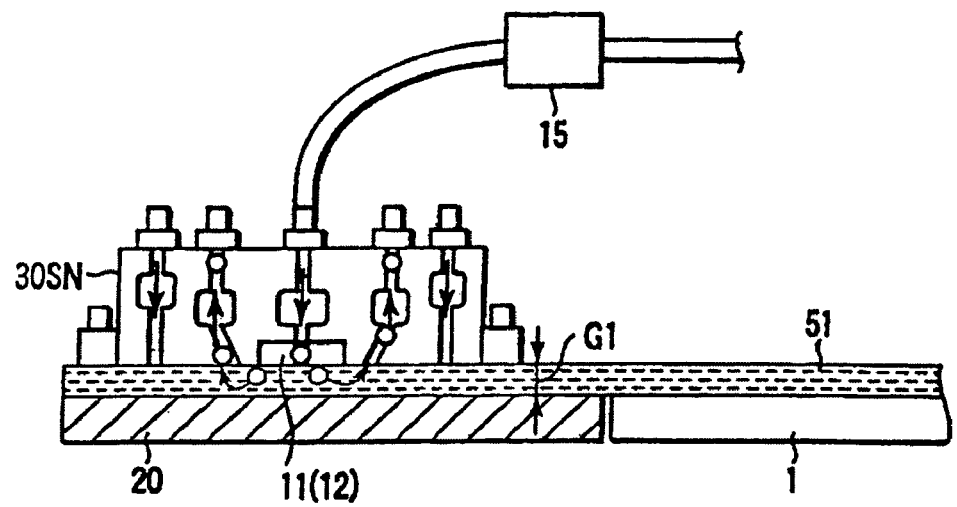
FIG. 10 is a sectional view adopted to explain another modified example of the fifth embodiment.
Figure 11:
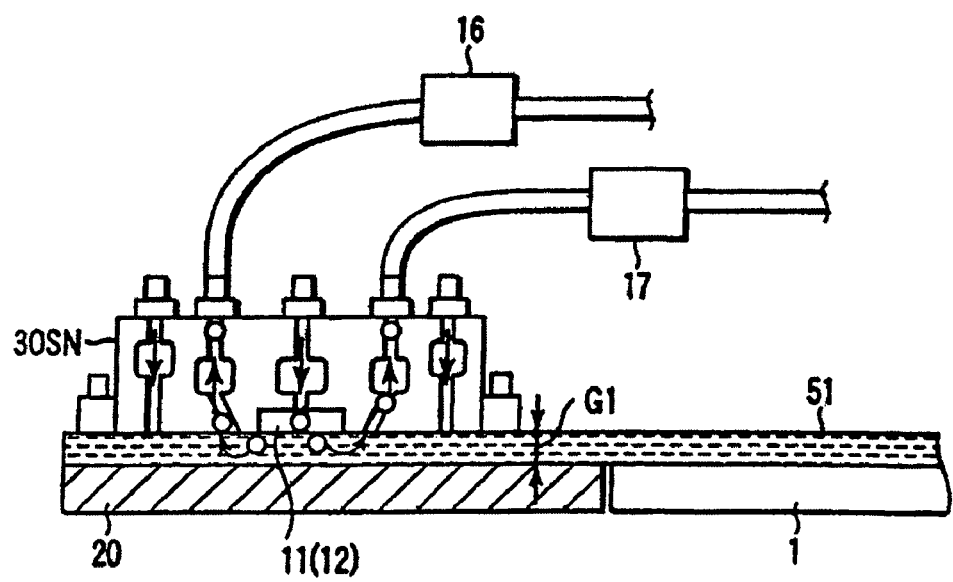
FIG. 11 is a sectional view adopted to explain still another modified example of the fifth embodiment.

FIGS. 9 to 11 each show an modified embodiment of the present embodiment. FIG. 9 shows an embodiment of using an arm 14 capable of vertically vibrating the scan nozzle 30SN in a state in which the scan nozzle 30SN is held instead of the vibrator 13.

FIG. 10 shows a modified embodiment of using a vibration mechanism 15 which applies vibration (including pulsation) to the chemical solution introduced into the chemical solution inlet 31, thereby making it easy to move the air bubbles in the chemical solution inlet 31.

FIG. 11 shows a modified embodiment of using the vibration mechanism 15 which applies vibration (including pulsation) to the liquid discharged from the liquid solution exits $32_1$, $32_2$ instead of the vibrator 13, thereby making it easy to move the air bubbles in the chemical solution inlet 31.

The above modified examples shown in FIGS. 9 to 11 can also be applied to any of the first, second and fourth embodiments.

The present invention is not limited to the above-described embodiments. For example, while the above embodiments have described a case of applying the present invention to developing of a resist on a wafer, the present invention can also be applied to, for example, wet etching of a film (insulation film, electrically conducting film) on a wafer; developing of a photosensitive film on a substrate in a photo mask fabrication process for the manufacture of a semiconductor; wet etching; a stripping process; a cleaning or color filter fabrication process; or developing or cleaning in a process for processing a disk such as DVD.

In addition, a gap produced during bubble removal can be changed in accordance with a diameter of each of the air bubbles or foreign objects existing in the chemical solution dispensing port.

While the first to fifth embodiments have described a method for removing air bubbles in a supplied chemical solution, the sixth embodiment described later describes a method for monitoring particles included in a sucked chemical solution, and terminating a chemical solution process according to the number of particles. According to the fifth embodiment, it becomes possible to remove the particles before drying a substrate surface. Further, the particles contained in the chemical solution are restricted from adhering to the substrate surface, and the yielding is improved. Note that the particles are by-products caused at the time of developing (resist residue) or metallic or organic particles and the like which may exist on the substrate.

Sixth Embodiment

Figure 12:
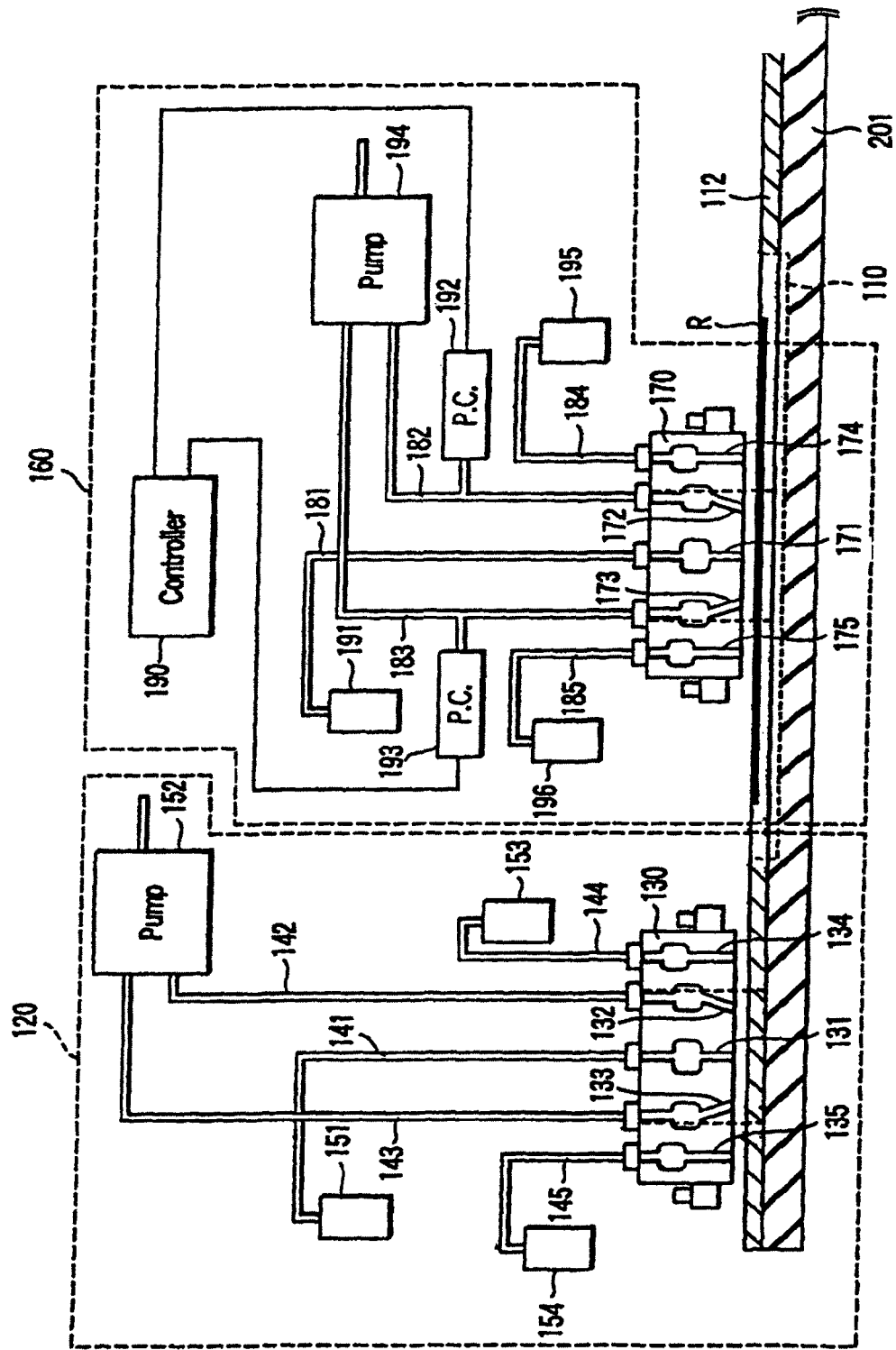
FIG. 12 is a view showing an outline construction of a substrate processing part in a substrate developing device according to a sixth embodiment.

FIG. 12 is a view showing an outline construction of a substrate processing section in a substrate developing device according to a sixth embodiment of the present invention. As shown in FIG. 12, the developing device comprises: a substrate 110; a substrate holding mechanism for substantially horizontally holding a semiconductor wafer, for example; a developing unit 120; a cleaning unit 160; and a scan stage 201.

The developing unit 120 comprises: a developing solution dispensing port 131; suction ports 132, 133; a pre-wet liquid solution dispensing port 134; and a rinse solution dispensing port 135 in a developing solution dispensing/sucking head 130. A developing solution canister 151 is connected to the developing solution dispensing port via a pipe 141. A pump 152 is connected to the suction ports 132, 133 via pipes 142, 143. A pre-wet liquid solution canister 153 is connected to the pre-wet liquid solution dispensing port 134 via a pipe 144. A rinse solution canister 154 is connected to the rinse solution dispensing port 135 via a pipe 145. A construction of the developing unit 120 is similar to that described in Jpn. Pat. Appln. KOKAI Publication No. 2002-252167 described previously, and a duplicate description is omitted here.

Figure 13:
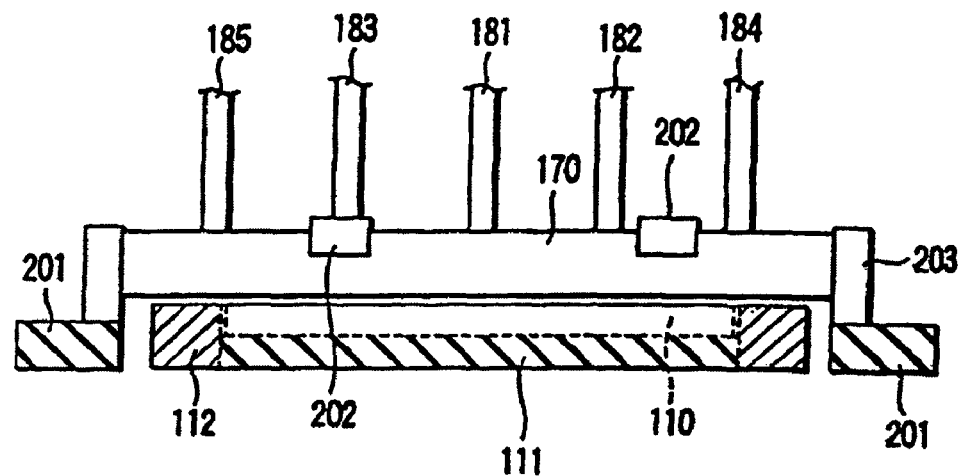
FIG. 13 is a sectional view showing a construction of an ozone water dispensing/sucking head according to the sixth embodiment.
Figure 14:
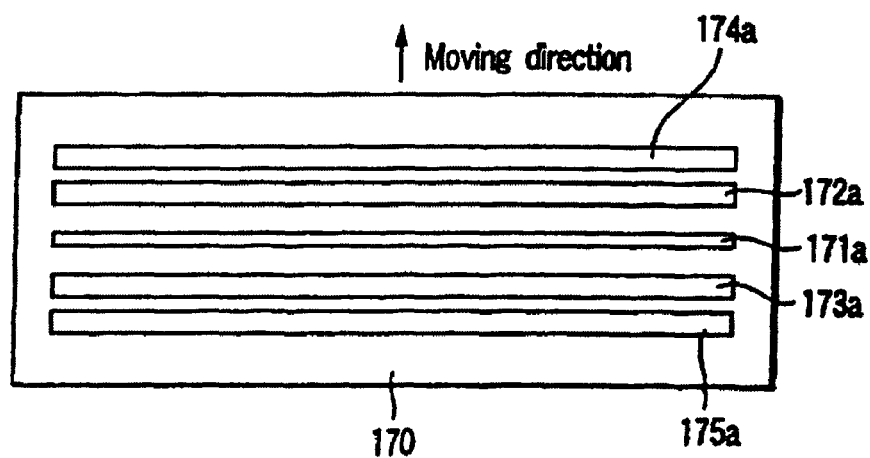
FIG. 14 is a bottom view showing the ozone water dispensing/sucking head in the developing device according to the sixth embodiment.
Figure 15:
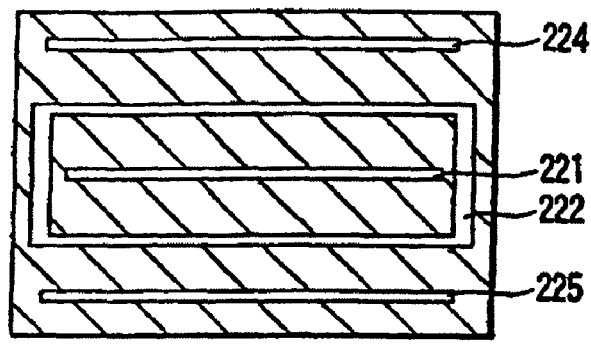
Figure 16:
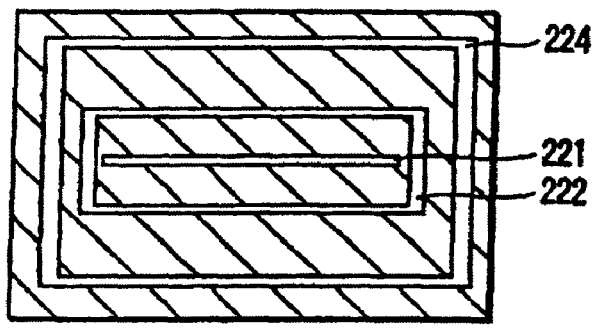
Figure 17:
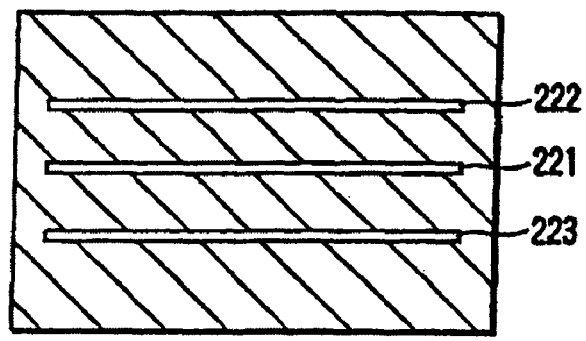

A construction of the cleaning unit 160 will be described with reference to FIGS. 12 to 14. FIG. 13 is a view showing a construction of an ozone water dispensing/sucking head, and FIG. 14 is a plan view when the ozone water dispensing/sucking head in the developing device is seen from the bottom.

The cleaning unit 160 comprises an ozone water dispensing/sucking head 170 which can be scanned on the substrate 110 by the scan stage 201. The ozone water dispensing/sucking head 170 comprises: an ozone water dispensing port (first dispensing port) 171; first and second suction ports 172, 173; and first and second rinse solution dispensing ports (second and third dispensing ports) 174, 175.

The ozone water dispensing port 171 has an ozone water dispensing outlet (first dispensing outlet) 171a on a lower face of the ozone water dispensing/sucking head 170. The first and second rinse solution dispensing outlet ports 174, 175 have first and second rinse solution dispensing outlets (second and third dispensing outlets) 174a, 175a, respectively, on a lower face of the ozone water dispensing/sucking head 170. The first and second suction ports 172, 173 have first and second sucking inlets 172a, 173a on a lower face of the ozone water dispensing/sucking head 170.

In the present embodiment, the ozone water dispensing outlet 171a; the first and second rinse solution dispensing outlets 174a, 175a; and the first and second sucking inlets 172a, 173a has long edges in a direction vertical to a scanning direction. These elements are shaped in an elongated port which has short edges in a direction parallel to a moving direction.

An ozone water generator 191 is connected to the ozone water dispensing port 171 via a pipe 181. Particle counter (measuring mechanism, P.C.) 192, 193, and a pump 194 are connected to the suction ports 172, 173 via pipes 182, 183. The particle counters 192, 193 measure the number of particles by scattering light beams caused by light emission. Rinse solution canisters 195, 196 are connected to the rinse solution dispensing ports 174, 175 via pipes 184, 185.

On a side face of the ozone water dispensing/sucking head 170, a cap measuring mechanism 202 using laser light is provided in order to measure a gap between a lower face of the ozone water dispensing/sucking head 170 and an upper face of the semiconductor wafer 110 placed on a substrate holder 111.

A moving mechanism has a scan stage 201. A gap adjusting mechanism 203 is provided both end parts of the ozone water dispensing/sucking head 170. The adjusting mechanism is mounted to be integrated with the ozone water dispensing/sucking head 170 so as to be movable on the scan stage 201 in a vertical direction.

The gap adjusting mechanism 203 comprises a piezoelectric element so that a gap between the lower face of the ozone water dispensing/sucking head 170 and the upper face of the semiconductor wafer 110 placed on the substrate holder (vacuum chuck) 111 is adjusted to a predetermined value on the basis of a result of measurement obtained by the gap measuring mechanism 202.

The substrate holding mechanism comprises the substrate holder 111 and an auxiliary plate 112. A substrate 110 is placed on the substrate holder 111. The auxiliary plate 112 is laid out at the periphery of the substrate holder 111. The auxiliary plate 112 can move vertically so that a surface of the substrate 110 is equal to that of the auxiliary plate 112 in height during developing. In this manner, when the developing solution is sucked by the ozone water dispensing/sucking head 170, a sucking force functions equally in a wafer face.

It is preferable to select the auxiliary plate 112 made of a material such that the wetting properties between the substrate of the plate and that of the substrate become equal to each other. Specifically, a contact angle of the developing solution on the substrate is set so as to be equal to that of the developing solution on the auxiliary plate 112.

Now, developing and cleaning processes using the above described devices will be described here. The developing solution is supplied into the developing solution dispensing port 131 by pressurizing the developing solution canister 151. The developing solution is continuously dispensed from a developing solution dispensing port 131*a* of the developing solution dispensing port 131 to the substrate 110. When the developing solution is dispensed, a pre-wet liquid solution is supplied into the pre-wet liquid solution dispensing port 134 by pressurizing the pre-wet liquid solution canister 153. The pre-wet liquid solution is continuously dispensed from a dispensing outlet of the pre-wet liquid solution dispensing port 134 to the substrate 110. A rinse solution is supplied into the rinse solution dispensing port 135 by pressurizing the rinse solution canister 154. This rinse solution is continuously dispensed from a dispensing outlet of the rinse solution dispensing port 135 to the substrate 110.

The suction ports 132, 133 suck a solution on a substrate by applying a pump sucking force. A mixture liquid solution between the developing solution and the pre-wet liquid solution is sucked through a sucking inlet of the suction port 132. A mixture liquid solution between the developing solution and the rinse solution is sucked through a sucking inlet of the suction port 133.

As has been described above, while sucking and rinse solution dispensing are carried out at the same time, the port is scanned with a gap of about 100 microns being maintained on a photo mask substrate, and a developing process is carried out. After the developing process has been carried out, the head 130 is retracted from the top of the substrate, and an entire face on the photo mask is kept in a state in which the rinse solution remains (no dry region).

Now, a cleaning process will be described here. The cleaning process is carried out while the rinse solution is filled on the photo mask substrate after developing of a photo resist film has been carried out.

An ozone water is supplied from the ozone water generator 191 into the ozone water dispensing port 171. The ozone water is dispensed from the ozone water dispensing outlet 171*a* of the ozone water dispensing port 171 to the substrate. In addition, when the ozone water is dispensed, the rinse solution is supplied into the rinse solution dispensing ports 174, 175 by pressurizing the rinse solution canisters 195, 196. The solution on the substrate 110 is sucked through the first and second suction ports 172, 173 by applying the sucking force of the pump 194. Both of the ozone water and the rinse solution enter the sucking inlet. As described above, while ozone water dispensing, sucking, and rinse solution dispensing are carried out at the same time, the head 170 is reciprocally scanned on the surface of the photo mask substrate, and the cleaning process is carried out. During reciprocal scanning, a gap between the substrate surface and the head lower face is set to about 100 microns.

During the cleaning process, the number of particles included in a solution (chemical solution) sucked from the sucking inlet is measured by means of the particle counters 192, 193. For example, the number of particles is measured by using scattering light beams caused by light emission. A measurement value and measurement position information are transmitted to a controller 190. The controller 190 compares a measurement value in a target region R with a predetermined value. In the case where the measurement values are greater than the predetermined value in all the target regions on the substrate, the controller 190 causes the cleaning process to be continued. In contrast, in the case where the measurement values in all the target regions on the substrate are equal to or smaller than the predetermined value, the controller 190 causes the scanning and cleaning processes of the head 70 to be terminated at a time point at which the ozone water dispensing/sucking head reaches an end part of the substrate. Then, the substrate is dried.

In the case of the present embodiment, the number of particles became 0, which excludes the number of microscopic bubbles, in the target region R at a third reciprocal movement. Thus, the head scanning and cleaning processes are interrupted after three and half reciprocal movements, and then, the substrate was dried. When a defect evaluation was carried out by a mask defect inspecting device with respect to a formed pattern, the number of defects was 0 in a pattern area of about 120 mm×120 mm.

It is preferable to count the number of particles by using the particle counters 192, 193, after the solution sucked through the first and second sucking ports 172*a*, 173*a* has been degassed. Particle counting by the particle counters may count air bubbles contained in a solution as a noise. In accordance with the methods of the first to fifth embodiments, the number of particles is counted after the microscopic bubbles have been removed from the inside of the liquid solution, thereby making it possible to precisely count the number of particles.

In the present embodiment, the layouts of the chemical solution dispensing ports and sucking ports are not limited to the above-described layouts. For example, these ports can be laid out in location as shown in FIGS. 15 to 20 and can be laid out in any other similar location. In FIGS. 15 to 20, reference numeral 221 denotes a first chemical solution dispensing port; 222 denotes a first sucking port; 223 denotes a second sucking port; 224 denotes a second chemical solution dispensing port; 225 denotes a third chemical solution port; 226 denotes a third sucking port 227 denotes a fourth sucking port; 228 denotes a third chemical solution dispensing port; 229 denotes a fourth chemical solution dispensing port; 230 denotes a fifth chemical solution dispensing port; and 231 denotes a sixth chemical solution dispensing port.

In the present embodiment, although the developing solution dispensing/sucking head and the ozone water dispensing/sucking head are relatively scanned on a substrate surface, relative scanning is not always required, depending on the size of the head or the size of the target region R. Although the developing solution dispensing/sucking head and the ozone water dispensing/sucking head has been moved, the substrate may be moved. In addition, the substrate and the developing solution dispensing/sucking head and the ozone water dispensing/sucking head may be moved.

While the present, embodiment has shown an application example relating to mask developing, the present invention is not limited thereto. For example, the present invention can be applied to, for example, a wafer developing process or a rinse process; wet etching of an opaque film on a substrate in a photo mask fabrication process for the manufacture of a semiconductor or cleaning of a variety of substrates such as a photo mask; and developing in a color filter fabrication process and a process for processing a disk such as DVD.

Figure 21:
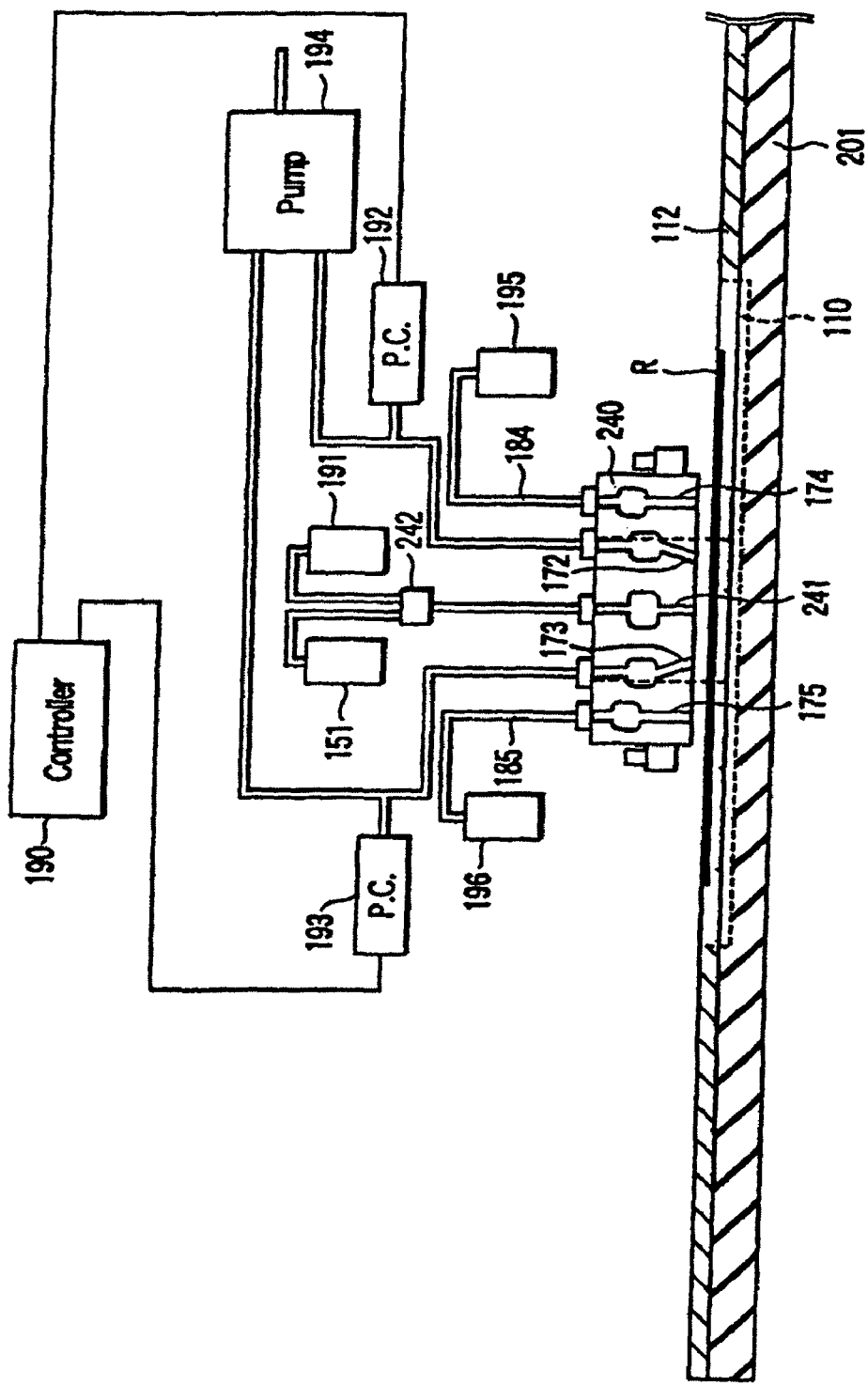
FIG. 21 is a schematic sectional view showing an outline construction of a developing/cleaning device according to the sixth embodiment.

FIG. 21 is a view showing an outline construction of a developing/cleaning device according to a modified example of the sixth embodiment. Like constituent elements in FIG. 12 are designated by like reference numerals, and a detailed description is omitted here.

As shown in FIG. 21, a chemical solution dispensing port 241 is provided at a developing/cleaning head 240. The developing solution canister 151 and the zone water generator 191 are connected to the chemical liquid solution port 241 via a switching device 242.

In the case of this apparatus, a chemical solution supplied to the chemical solution dispensing port 241 is switched by the switching device 242, whereby a developing process and a cleaning process can be carried out by one head 240.

The following method can also be used to determine the end of the cleaning process according to the number of particles. If the number of particles counted at a sucking port at the frontal side in the scanning direction has become equal to that counted at a sucking port at the rear side in the scanning direction, scanning is terminated at a time point when the nozzle has moved up to the nozzle scanning end position, and the rinse process is terminated.

When the processing termination is thus determined, incorrect sensing of particles due to an effect of the bubbles which exist in the liquid can be restricted.

The present invention is not limited to the above-described embodiments. For example, while the above embodiments have described the cleaning process that follows the developing process, the present invention can be used for a cleaning process that follows an etching process. In addition, an electrolytic ion water or a pure water can be used instead of the ozone water.

The substrate processing method and the substrate processing apparatus according to the sixth embodiment are summarized as follows.

The substrate processing method according to the sixth embodiment is directed to a substrate processing method for supplying a chemical solution to a substrate, and then, processing a target region of the substrate by using the chemical solution, the method including:

laying out on a target region a chemical solution dispensing/sucking part of which a dispensing port for dispensing the chemical solution and a sucking port for sucking a solution on the substrate are laid out on a lower face thereof; dispensing the chemical solution from the dispensing port of the chemical solution dispensing/sucking part against the substrate; sucking the solution on the substrate at the sucking port during the dispensing; counting the number of particles included in the solution sucked through the sucking port during the sucking; and in the case where a count value of the number of particles included in the solution sucked in the target region is equal to or smaller than a predetermined value, stopping dispensing of the chemical solution.

During the dispensing, the chemical solution dispensing/sucking part can be scanned on the substrate surface relatively.

The chemical solution is provided as a developing solution, an ozone water, an electrolytic ion water, or a pure water.

It is preferable that air bubbles are removed from the chemical solution sucked through the sucking port.

The substrate processing apparatus according to the sixth embodiment is directed to a substrate processing apparatus for supplying a chemical solution to a substrate, and then, processing a target region of the substrate by using the chemical solution, the apparatus comprising: a substrate holding mechanism which holds a substrate; a chemical solution dispensing/sucking part which comprises a chemical supply system including a lower face opposed to the substrate and a first chemical solution dispensing nozzle which dispenses a first chemical solution from a first chemical solution dispensing port arranged on the lower face, and a solution sucking system comprising a first sucking nozzle which sucks the solution on the substrate from a first sucking port arranged on the lower face; a counting mechanism which counts the number of particles included in the solution sucked by the solution sucking system; and a determining part, in the case where the number of particles counted by this counting mechanism is equal to or smaller than a predetermined value, which terminates the chemical solution processing.

The counting mechanism counts the number of particles by the scattering light beams caused by light emission.

This apparatus can further comprise a scanning mechanism which relatively scans the chemical solution dispensing/suction part on the substrate.

The chemical solution supply system further comprises second and third chemical solution dispensing nozzles for dispensing second and third chemical solutions from second and third chemical solution dispensing outlets arranged on the lower face, respectively. The solution sucking system further comprises a second sucking nozzle for sucking a solution on the substrate from the second sucking port arranged on the lower face. The first, second, and third chemical solution dispensing ports and the first and second sucking ports are arranged along the scanning direction. The first and second sucking ports are arranged so as to sandwich the first chemical solution dispensing port between the sucking ports. The second and third chemical solution dispensing ports are arranged so as to sandwich the first and second sucking ports between the dispensing outlets.

The solution sucking system further comprises a second sucking nozzle which sucks a solution on the substrate from the second sucking port arranged on the lower face. The first and second sucking ports are laid out so as to sandwich the first chemical solution dispensing port between the sucking ports.

The first sucking port is laid out so as to surround the first chemical solution dispensing port.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

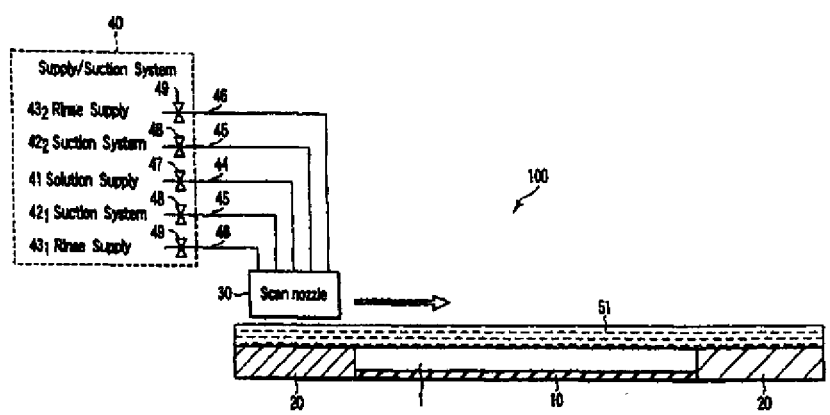

What is claimed is:

1. An apparatus for processing a substrate comprising:
a substrate holding mechanism which includes a holding plate for holding a target substrate to be processed, the target substrate having a first main face;
a chemical solution dispensing/sucking mechanism including a chemical solution dispensing port for dispensing a first chemical solution onto the first main face and a chemical solution suction port for sucking a chemical solution including the first chemical solution;
an auxiliary plate having a second main face with a recess portion having a closed bottom portion, the auxiliary plate surrounding the holding plate to form a depressed portion on the holding plate by the auxiliary plate, the depressed portion housing the target substrate held on the holding plate in which the second main face is substantially flush with the first main face, the recess portion for receiving the first chemical solution dispensed from the chemical solution dispensing port, and the recess portion being wider than an area including the chemical solution dispensing port and the chemical solution suction port;
at least one determining mechanism which determines whether a bubble is present or absent in the chemical solution dispensing port; and
a vibration mechanism which vibrates the first chemical solution and a second chemical solution.

2. The apparatus according to claim 1, wherein the determining mechanism for determining whether a bubble is present or absent in the chemical solution dispensing port includes a light source for emitting light to an inside of the chemical solution dispensing port in parallel to a longitudinal direction;
   a light receiving element for receiving the light emitted from the light source; and
   a deciding device for deciding whether the air bubble is present or absent in the chemical solution dispensing port from a quantity of the light received by the light receiving element and a threshold value of the light quantity.

3. The apparatus according to claim 1, wherein the vibration mechanism for vibrating the first chemical solution and the second chemical solution includes a vibrator for vibrating the chemical solution dispensing/sucking mechanism.

4. The apparatus according to claim 1, wherein the vibration mechanism for vibrating the first chemical solution and the second chemical solution includes a vibrator attached to a pipe connected to at least one of the chemical solution dispensing port and the chemical solution suction port.

5. The apparatus according to claim 1, further comprising:
   a counting mechanism for counting a number of particles included in the first chemical solution and the second chemical solution sucked by the chemical solution suction port; and
   a controller for terminating chemical solution processing in a case where the number of the particles counted by the counting mechanism is equal to or smaller than a predetermined value.

6. The apparatus according to claim 5, wherein the counting mechanism counts the number of the particles by using scattering light beams caused by light emission.

7. The apparatus according to claim 1, wherein the recess portion receives the first chemical solution dispensed onto the first main face of the substrate holding mechanism.

\* \* \* \* \*

UNITED STATES PATENT AND TRADEMARK OFFICE
CERTIFICATE OF CORRECTION

| | | |
|---|---|---|
| PATENT NO. | : 8,025,732 B2 | Page 1 of 2 |
| APPLICATION NO. | : 12/071235 | |
| DATED | : September 27, 2011 | |
| INVENTOR(S) | : Sakurai et al. | |

It is certified that error appears in the above-identified patent and that said Letters Patent is hereby corrected as shown below:

Delete Title Pg, and replace with new Title Pg. (attached)

In the Claims, below final line of claim 7, column 24, line 16, please insert the following:

-- 8. The apparatus according to claim 1, wherein the at least one determining mechanism is provided at the chemical solution dispensing port. --

Signed and Sealed this
Twenty-seventh Day of December, 2011

David J. Kappos
*Director of the United States Patent and Trademark Office*

(12) United States Patent
Sakurai et al.

(10) Patent No.: US 8,025,732 B2
(45) Date of Patent: Sep. 27, 2011

(54) APPARATUS FOR PROCESSING A SUBSTRATE

(75) Inventors: Hideaki Sakurai, Yokohama (JP); Masamitsu Itoh, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 179 days.

(21) Appl. No.: 12/071,235

(22) Filed: Feb. 19, 2008

(65) Prior Publication Data

US 2008/0173400 A1  Jul. 24, 2008

Related U.S. Application Data

(62) Division of application No. 11/103,472, filed on Apr. 12, 2005, now Pat. No. 7,354,869.

(30) Foreign Application Priority Data

Apr. 13, 2004 (JP) ............... 2004-118279
Jun. 28, 2004 (JP) ............... 2004-189928

(51) Int. Cl.
*H01L 21/027* (2006.01)
*G03F 7/30* (2006.01)

(52) U.S. Cl. .................. 118/725; 156/345.12

(58) Field of Classification Search ........... 156/345.15, 156/345; 118/725
See application file for complete search history.

(56) References Cited

U.S. PATENT DOCUMENTS

| | | |
|---|---|---|
| 6,425,497 B1 * | 7/2002 | Chu et al. ............ 222/64 |
| 6,550,990 B2 | 4/2003 | Sakurai et al. |
| 6,929,903 B2 | 8/2005 | Itoh et al. |
| 2004/0106072 A1 | 6/2004 | Itoh et al. |
| 2008/0173400 A1 * | 7/2008 | Sakurai et al. ......... 156/345.15 |

FOREIGN PATENT DOCUMENTS

| | | |
|---|---|---|
| JP | 10-092784 | 4/1998 |
| JP | 2000-228385 | 8/2000 |
| JP | 2000-306809 | 11/2000 |
| JP | 2002-252167 A2 | 9/2002 |
| JP | 2002-343711 | 11/2002 |

OTHER PUBLICATIONS

Machine Translation of JP 10-092784. Published Apr. 10, 1998 *
Machine Translation of JP 2002-343711. Published Nov. 29, 2002.*
"Notification of Reasons for Rejection" mailed Dec. 2, 2008, issued by the Japanese Patent Office in copending U.S. Appl. No. 2004-118279.
Notice of Reasons for Rejection mailed by the Japanese Patent Office on Nov. 18, 2008, for Japanese Patent Application 2004-189928.

* cited by examiner

*Primary Examiner* — Sylvia R. MacArthur
(74) *Attorney, Agent, or Firm* — Finnegan, Henderson, Farabow, Garrett & Dunner. L.L.P.

(57) ABSTRACT

A method for a substrate processing apparatus having a substrate holding mechanism and a chemical solution dispensing/sucking mechanism including a chemical solution dispensing port for supplying a first chemical solution and a chemical solution suction port, includes placing the target substrate on the substrate holding mechanism, laying out an auxiliary plate at a periphery of the substrate such that the two main faces are substantially flush with each other, supplying a second chemical solution onto the main faces, dispensing the first solution from the dispensing port and sucking the first and second solutions through the suction port, with the dispensing and suction ports brought into contact with the second solution, and while dispensing the first solution from the dispensing port and sucking the first solution through the suction port, scanning the dispensing/sucking mechanism such that the dispensing and suction ports are opposed to the main face of the substrate.

8 Claims, 14 Drawing Sheets